United States Patent
Hashimoto et al.

(10) Patent No.: US 7,639,554 B2
(45) Date of Patent: Dec. 29, 2009

(54) SEMICONDUCTOR DEVICE AND METHOD OF TESTING SEMICONDUCTOR DEVICE

(75) Inventors: Kiyokazu Hashimoto, Kanagawa (JP); Nobutoshi Tsunesada, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 161 days.

(21) Appl. No.: 12/018,993

(22) Filed: Jan. 24, 2008

(65) Prior Publication Data

US 2008/0192554 A1 Aug. 14, 2008

(30) Foreign Application Priority Data

Feb. 8, 2007 (JP) .............................. 2007-028722

(51) Int. Cl.
    *G11C 29/00* (2006.01)
(52) U.S. Cl. ................................. 365/201; 365/230.03
(58) Field of Classification Search ................. 365/201, 365/230.03
    See application file for complete search history.

(56) References Cited

U.S. PATENT DOCUMENTS

2003/0156473 A1* 8/2003 Sinclair et al. .............. 365/200

FOREIGN PATENT DOCUMENTS

| JP | 7-13954 A | 1/1995 |
|---|---|---|
| JP | 2001-67895 A | 3/2001 |
| JP | 2002-304898 A | 10/2002 |
| JP | 2003-346499 A | 12/2003 |

* cited by examiner

*Primary Examiner*—Vu A Le
(74) *Attorney, Agent, or Firm*—Sughrue Mion, PLLC

(57) ABSTRACT

A semiconductor device includes: a first memory; and a second memory. The first memory includes: a first memory cell array configured to be divided into a plurality of sectors, an erasure time setting register configured to hold a sector erasure assurance time to assure an erasure time for erasing data stored in one sector, and a first control circuit configured to execute a sector erasure test in which data stored in at least one selected sector selected from the plurality of sectors are erased within the sector erasure assurance time. The second memory includes: a second memory cell array configured to have a data storage system different from that of the first memory cell array, and a second control circuit configured to execute a data hold test with respect to the second memory cell array while the sector erasure test is executed.

13 Claims, 17 Drawing Sheets

SEMICONDUCTOR DEVICE AND METHOD OF TESTING SEMICONDUCTOR DEVICE

BACKGROUND OF THE INVENTION

1. Field of the Invention

The present invention relates to a semiconductor device and a method of testing the semiconductor device. In particular, the present invention relates to a method of testing a semiconductor device which has a plurality of memories using different data storage methods. This application is based upon and claims the benefit of priority from Japanese patent application No. 2007-028722 filed on Feb. 8, 2007, the disclosure of which is incorporated herein in its entirety by reference.

2. Description of Related Art

With sophistication and enhancement of functionality of systems in recent years, MCP (Multi-Chip-Package) has been put into practical use. The MCP has a plurality of memories using different data storage methods (having different configurations) in the same package. Accordingly, memory capacity has continuously increased. It is necessary to conduct a test of checking functions of these memories prior to shipment. However, as capacity and kind of the memories included in the same package is increased more, a test time necessary for conducting the test becomes longer. As a result, test cost is increased, causing a problem that the semiconductor device cannot be provided at a low price. For this reason, there is a demand for a semiconductor device and a method of testing the semiconductor device which can reduce test time and test cost.

A first related art of reducing test time and test cost is disclosed in Japanese Laid-Open Patent Application JP-P 2001-067895 A (corresponding to U.S. Pat. No. 6,647,522 (B1)). In the first related art, as shown in FIG. 1 of JP-P 2001-067895 A, a semiconductor device (31) includes memory circuits (32, 33) having different structures, an operation control scan chain (34), signal control circuits (35, 36), failure determination circuits (37, 38) and an OR circuit (39) as a signal synthesis circuit, which are provided to perform an operation test of these memory circuits. These elements are formed in single chip. In the first related art, by providing one test pattern data to the memory circuits (32, 33) simultaneously and conducting operation tests of the memory circuits (32, 33), test time is reduced.

A second related art of reducing test time and test cost is disclosed in Japanese Laid-Open Patent Application JP-P 2002-304898 A. In the second related art, as shown in Figs. 2 and 4 of JP-P 2002-304898 A, after predetermined data is written into each memory cell of a SRAM chip, power source voltage VDDS of the SRAM chip is set to be lower than ordinary level, signal level of a chip enable signal #CE of the SRAM chip is set to a high level "H" to set the SRAM chip to standby state. In this data holding time, various tests of the flash chip are conducted, resulting in reduction of test time.

A third related art of reducing test time and test cost is disclosed in Japanese Laid-Open Patent Application JP-P 2003-346499 A (corresponding to U.S. Pat. No. 6,826,101 (B2) In the third related art, as shown in FIG. 1 (first embodiment), FIG. 2 (first test pattern) and FIG. 3 (flow chart of a data writing test in FIG. 1) of JP-P 2003-346499 A, in a semiconductor device including a flash ROM (40) and a logic circuit (30), the logic circuit (30) is tested in a writing period of the flash ROM (waiting time when a test pattern need not be inputted). The semiconductor device has a switching means of selecting either of an input path for test of the logic circuit (30) and an input path for test of the flash ROM (40) on the basis of a mode selection signal "mode" inputted from a control external terminal (53-2).

The third related art will be specifically described. First, a program is run (step S1 in FIG. 3 of JP-P 2003-346499 A) and a pattern input period T1 for writing into the flash ROM (40) passes (FIG. 2, a step S2 in FIG. 3 of JP-P 2003-346499 A). At this time, according to the mode selection signal "mode", selectors (62-11, 62-12, 62-21, . . . ) are switched to the side of the logic circuit (30) and a test data path from external terminals (51-1, 51-2, . . . ) is switched from the side of the flash ROM (40) to the side of the logic circuit (30) (a step S3 in FIG. 3 of JP-P 2003-346499 A). Since the flash ROM (40) is in a wait state in the writing period T2 (200 μs) (FIG. 2 and step S4 in FIG. 3 of JP-P 2003-346499 A), during a logic pattern input period T3 which is equal to the writing period T2, a logic test pattern for testing the logic circuit (30) is inputted into the external terminals (51-1, 51-2, . . . ) at for 200 μs or less (FIG. 2 and a step S5 in FIG. 3 of JP-P 2003-346499 A). The logic test pattern inputted at the step S5 is sent to the logic circuit (30) through selectors (61-11, 61-12, 62-11, 62-1, 63-11, 63-12, . . . ). Then, a test operation is conducted at the logic circuit (30) and the test result is outputted from the external terminals (52-1, . . . ) through selectors (63-31, 62-21, 61-31, . . . ). The test result is tested by a tester to check whether or not the logic circuit (30) normally operates. Meanwhile, in the writing period T2 of the flash ROM (40), a memory test pattern of a first word is written into a memory cell for one word. When the time of 200 μs and the writing period T2 have passed, according to the mode selection signal "mode", selectors (62-11, 62-12, 62-21, . . . ) are switched to the side of the flash ROM (40) and a test data path is switched from the side of the logic circuit (30) to the side of the flash ROM (40) (step S6 in FIG. 3 of JP-P 2003-346499 A). It is determined whether or not writing of all bits to the flash ROM (40) is finished. In this case, since only one word is written (No at a step S7 in FIG. 3 of JP-P 2003-346499 A), the procedure returns to the step S2 and a memory test pattern of a second word is written into a memory cell for the second word in the flash ROM (40) in the above-mentioned manner. When the above-mentioned processing is repeated by the number of memory cells of the flash ROM (40) and all bits of memory test pattern are finished, execution of the program is terminated (YES at the step S7 in FIG. 3 and S8 of JP-P 2003-346499 A). When execution of the program is terminated, all bits of data are output from the external terminals (52-1, . . . ) through selectors (63-41, 62-21, 61-31, . . . ). The read data is tested by a tester to check whether or not the flash ROM normally operates.

A fourth related art which relates to the technique of reducing test time and test cost is disclosed in Japanese Laid-Open Patent Application JP-A-Heisei 07-013954. In the fourth related art, as shown in FIG. 1 of JP-A-Heisei 07-013954, a microcomputer has an EEPROM (12) and a CPU (11) for controlling the whole of the microcomputer including the EEPROM (12) by a program. The microcomputer has a screening dedication test circuit (16) and a screening count register. The screening dedication test circuit (16) performs screening by writing and erasing data with respect to all or part of a storage area of the EEPROM (12), irrespective of a test conducted under control of the CPU (11) which is unrelated to the REPROM (12). At this time, the screening dedication test circuit (16) counts the number of times of screening on the basis of at least either of data writing or data erasure. The screening count register is formed of the EEPROM or another EEPROM and stores the count of the screening dedication test circuit (16) therein.

We have now discovered that the related arts have the following problems.

According to the first related art, one test pattern is supplied to a plurality of memory circuits simultaneously. For this reason, the first related art can be applied to a case where the plurality of memory circuits is the same memory type such as a RAM. However, there is a problem that memories using different data storage methods such as a RAM and a flash memory cannot be simultaneously tested due to difference between test conditions such as contents and speed.

The second related art fails to specifically describe the way to control the flash chip for conducting the test at the same time in the data holding period. For example, in a case where a memory capacity or the number of IO terminals of the SRAM chip is different from that of the flash memory chip, a method of controlling each of address terminals and IO terminals of the SRAM chip and the flash memory chip is unclear. Furthermore, according to the second related art, since the flash chip is tested in a state where a power source voltage VDDS of the SRAM chip is lowered, when power is supplied to the SRAM chip and the flash memory chip from the same power source, the SRAM chip and the flash memory chip cannot be tested at the same time.

According to the third related art, by conducting a test of another circuit (the logic circuit (30)) in the writing period of the flash ROM (40), test time is reduced. However, since the test of the another circuit is conducted by the unit of writing period for one word of the flash ROM (40), there is a problem that test having a long test time cannot be simultaneously conducted. That is, one attempts to apply the third related art to the flash ROM (40) and a DRAM and conduct a DRAM data holding test in the writing period of the flash ROM (40), the writing period for one word of the flash ROM (40) is generally a few μs to a few hundred of μs, while the DRAM data holding test generally requires test time of a few hundred of ms. Accordingly, in the third related art, contents of test that can simultaneously test the flash ROM (40) are limited and thus, the effect of reducing test time cannot be obtained. In addition, writing period of the flash ROM (40) is set to be longer than necessary to conduct the tests simultaneously, the specification of the writing period cannot be disadvantageously ensured.

SUMMARY

The present invention seeks to solve one or more of the above problems, or to improve upon those problems at least in part. In one embodiment, a semiconductor device includes: a first memory; and a second memory. The first memory includes: a first memory cell array configured to be divided into a plurality of sectors, an erasure time setting register configured to hold a sector erasure assurance time to assure an erasure time for erasing data stored in one sector, and a first control circuit configured to execute a sector erasure test in which data stored in at least one selected sector selected from the plurality of sectors are erased within the sector erasure assurance time. The second memory includes: a second memory cell array configured to have a data storage system different from that of the first memory cell array, and a second control circuit configured to execute a data hold test with respect to the second memory cell array while the sector erasure test is executed.

In another embodiment, a method of testing a semiconductor substrate, includes: providing a semiconductor device, wherein the semiconductor includes: a first memory including a first memory cell array divided into a plurality of sectors, and an erasure time setting register, and a second memory including a second memory cell array having a data storage system different from that of the first memory cell array; setting a sector erasure assurance time to assure an erasure time for erasing data stored in one sector in the erasure time setting register; executing a sector erasure test in which data stored in at least one selected sector selected from the plurality of sectors are erased within the sector erasure assurance time; and executing a data hold test with respect to the second memory cell array while the sector erasure test is executed.

In another embodiment, a method of testing a semiconductor substrate, includes: providing a semiconductor device, wherein the semiconductor includes: a first memory including a first memory cell array divided into a plurality of sectors, and an erasure time setting register, a second memory including a second memory cell array having a data storage system different from that of the first memory cell array, and a BIST (Built-In-Self-Test) circuit; the BIST circuit setting a sector erasure assurance time to assure an erasure time for erasing data stored in one sector in the erasure time setting register; the BIST circuit executing a sector erasure test in which data stored in at least one selected sector selected from the plurality of sectors are erased within the sector erasure assurance time; and the BIST circuit executing a data hold test with respect to the second memory cell array while the sector erasure test is executed.

Since a semiconductor device according to the present invention includes an erasure time setting register setting an assurance value of erasure time for one sector (sector erasure assurance time) in a first memory, the erasure time for one sector can be assured under an execution of a "plural sectors erasure test" of serially erasing data stored in selected sectors among a plurality of sectors. By activating a second memory under an execution of the "plural sectors erasure test" so as to test the second memory as well at the same time, a test which requires a long time such as a data holding test of the second memory and the test of the first memory can be simultaneously conducted. For example, since the erasure time for one sector is generally a few hundred of msec, in a case where a sector erasure assurance time of one sector is set to 500 msec in the erasure time setting register, when "erasure of eight sectors" is executed, four seconds can be collectively reserved, resulting in that it becomes possible to simultaneously conduct the test which requires long time such as the data holding test of the second memory.

BRIEF DESCRIPTION OF THE DRAWINGS

The above and other objects, advantages and features of the present invention will be more apparent from the following description of certain preferred embodiments taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Hereinafter, a semiconductor device according to the present invention will be described in detail referring to attached drawings.

First Embodiment

[Configuration]

Figure 1:
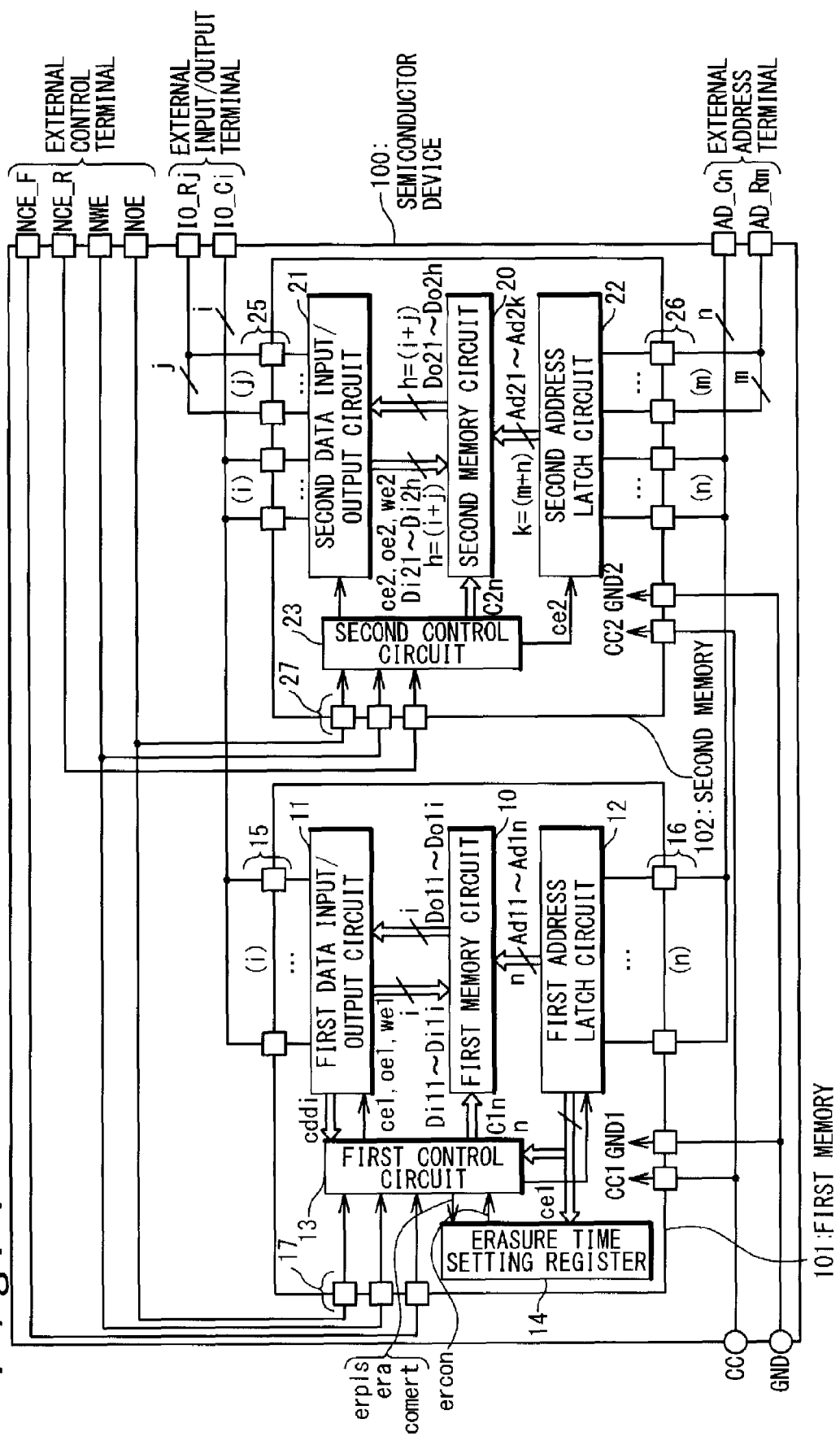
FIG. 1 is a block diagram showing a configuration of a semiconductor device 100 according to a first embodiment of the present invention.

FIG. 1 is a block diagram showing a configuration of a semiconductor device 100 according to a first embodiment of the present invention. The semiconductor device 100 in the first embodiment includes a plurality of memories. The plurality of memories includes a first memory 101 and a second memory 102. The first memory 101 has a data storage system different from that of the second memory 102 in respective internal memory cells. For example, the first memory 101 is a flash memory and the second memory 102 is a RAM (DRAM or SRAM).

The semiconductor device 100 further includes external terminals. The external terminals includes external address terminals AD_C1 to AD_Cn (n is an integer equal to or greater than 1), AD_R1 to AD_Rm (m is an integer equal to or greater than 1), and external input/output terminals IO_C1 to IO_Ci (i is an integer equal to or greater than 1), IO_R1 to IO_Rj (j is an integer equal to or greater than 1). The external address terminals AD_C1 to AD_Cn are commonly used for the flash memory 101 and the RAM 102. The external address terminals AD_R1 to AD_Rm are used only for the RAM 102. The external input/output terminals IO_C1 to IO_Ci are commonly used for the flash memory 101 and the RAM 102. The external input/output terminals IO_HR to IO_Rj are used only for the RAM 102. Actually, although the external address terminals AD_C1 to AD_Cn are n number of terminals and the external address terminals AD_R1 to AD_Rm are m number of terminals, they are partially omitted in FIG. 1 for simplification. Although the external input/output terminals IO_C1 to IO_Ci are i number of terminals and external input/output terminals IO_R1 to IO_Rj are j number of terminals, they are partially omitted in FIG. 1 for simplification.

For example, it is assumed that the flash memory 101 is a flash memory of 32 Mbits (2 M words×16 bits configuration) and the RAM 102 is a RAM of 256 Mbits (8 M words×32 bits configuration). In this case, the semiconductor device 100 includes, as external terminals, 21 number of common external address terminals AD_C1 to AD_C21 (n=21), 2 number of RAM dedicated external address terminals AD_R1 to AD_R2 (m=2), 16 number of common external input/output terminals IO_C1 to IO_C16 (i=16) and 16 number of RAM dedicated external input/output terminals IO_R1 to IO_R16 (j=16).

The semiconductor device 100 further includes external control terminals NOE, NWE, NCE_F, NCE_R as the external terminals. The external control terminal NOE is a terminal for controlling outputs of the flash memory 101 and the RAM 102. The external control terminal NWE is a terminal for controlling writing into the flash memory 101 and the RAM 102. The external control terminal NCE_F is a terminal for controlling activation/deactivation of the flash memory 101. The external control terminal NCE_R is a terminal for controlling activation/deactivation of the RAM 102.

The flash memory 101 includes a first memory circuit 10, a first data input/output circuit 11, a first address latch circuit 12, a first control circuit 13, a first data input/output terminal group 15, a first address input terminal group 16, a first control terminal group 17 and an erasure time setting register 14. First data input/output terminals of the first data input/output terminal group 15 are connected to i number of external data input/output lines connected to the external input/output terminals IO_C1 to IO_Ci, respectively. The first data input/output circuit 11 is connected to the first data input/output terminal group 15. First address input terminals of the first address input terminal group 16 are connected to n number of external address input lines connected to the external address terminals AD_C1 to AD_Cn, respectively. The first address latch circuit 12 is connected to the first address input terminal group 16. First control terminals of the first control terminal group 17 are connected to external control lines of external control line group, respectively. The external control lines are connected to the external control terminals NOE, NWE and NCE_F, respectively. The first control circuit 13 is connected to the first control terminal group 17, the first data input/output circuit 11 and the first address latch circuit 12 to control writing/erasure/reading operation of the first memory circuit 10. The erasure time setting register 14 receives outputs of the first control circuit 13 and the first address latch circuit 12 and sets erasure time with respect to "sector" as erasure unit of memory cells in the first memory circuit 10.

The RAM 102 includes a second memory circuit 20, a second data input/output circuit 21, a second address latch circuit 22, a second control circuit 23, a second data input/output terminal group 25, a second address input terminal group 26 and a second control terminal group 27. Second data input/output terminals of the second data input/output terminal group 25 are connected to i number of external data input/output input lines and j number of external data input/output input lines. Here, the i number of external data input/output input lines are connected to the external input/output terminals IO_C1 to IO_Ci. The j number of external data input/output input lines are connected to the external input/output terminals IO_R1 to IO_Rj. The second data input/output circuit 21 is connected to the second data input/output terminal group 25. Second address input terminals of the second address input terminal group 26 are connected to n number of external address input lines and m number of external address input lines. Here, the n number of external address input lines are connected to the external address terminals AD_C1 to AD_Cn. The m number of external address input lines are connected to the external address terminals AD_R1 to AD_Rm. The second address latch circuit 22 is connected to the second address input terminal group 26. Second control terminals of the second control terminal group 27 are connected to external control lines of external control line group. The external control lines are connected to the external control terminals NOE, NWE and NCE_F, respectively. The second control circuit 23 is connected to the second control terminal group 27, the second data input/output circuit 21 and the second address latch circuit 22 and controls a writing/erasure/reading operation of the second memory circuit 20.

Figure 2:
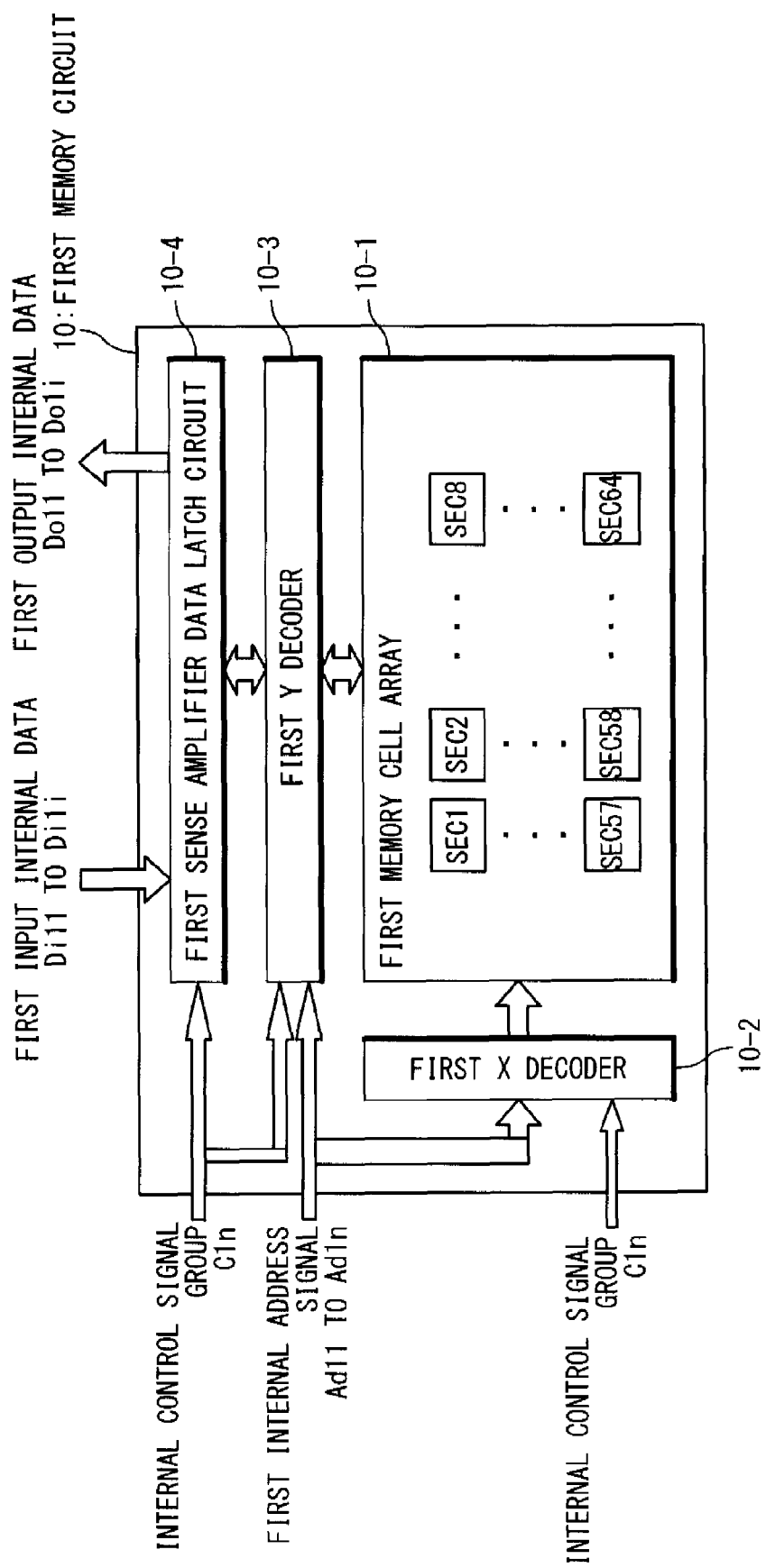
FIG. 2 is a block diagram showing a configuration of a first memory circuit 10 in FIG. 1.

FIG. 2 is a block diagram showing a configuration of the first memory circuit 10 in FIG. 1. The first memory circuit 10 includes a first memory cell array 10-1, a first X decoder 10-2, a first Y decoder 10-3 and a first sense amplifier data latch circuit 10-4. In the first memory cell array 10-1, flash memory cells are arranged in matrix. The first memory cell array 10-1 is divided into "sectors" as erasure units of the flash memory cells. In the present embodiment, the first memory cell array 10-1 is divided into 64 sectors as an example. The first X decoder 10-2 receives first internal address signals Ad11 to Ad1n as outputs of the first address latch circuit 12 and an internal control signal group C1n as an output of the first control circuit 13. Then, the first X decoder 10-2 selects an X address of the first memory cell array 10-1. The first Y decoder 10-3 receives the first internal address signals Ad11 to Ad1n and the internal control signal group C1n and selects a Y address of the first memory cell array 10-1. The first sense amplifier data latch circuit 10-4 receives the internal control signal group C1n. Then, in the reading operation, the first sense amplifier data latch circuit 10-4 supplies first output internal data Do11 to Do1i as data to be read from the first memory cell array 10-1 to the first data input/output circuit 11. In the writing operation, the first sense amplifier data latch circuit 10-4 writes first input internal data Di11 to Di1i as data to be written into the first memory cell array 10-1.

Figure 3:
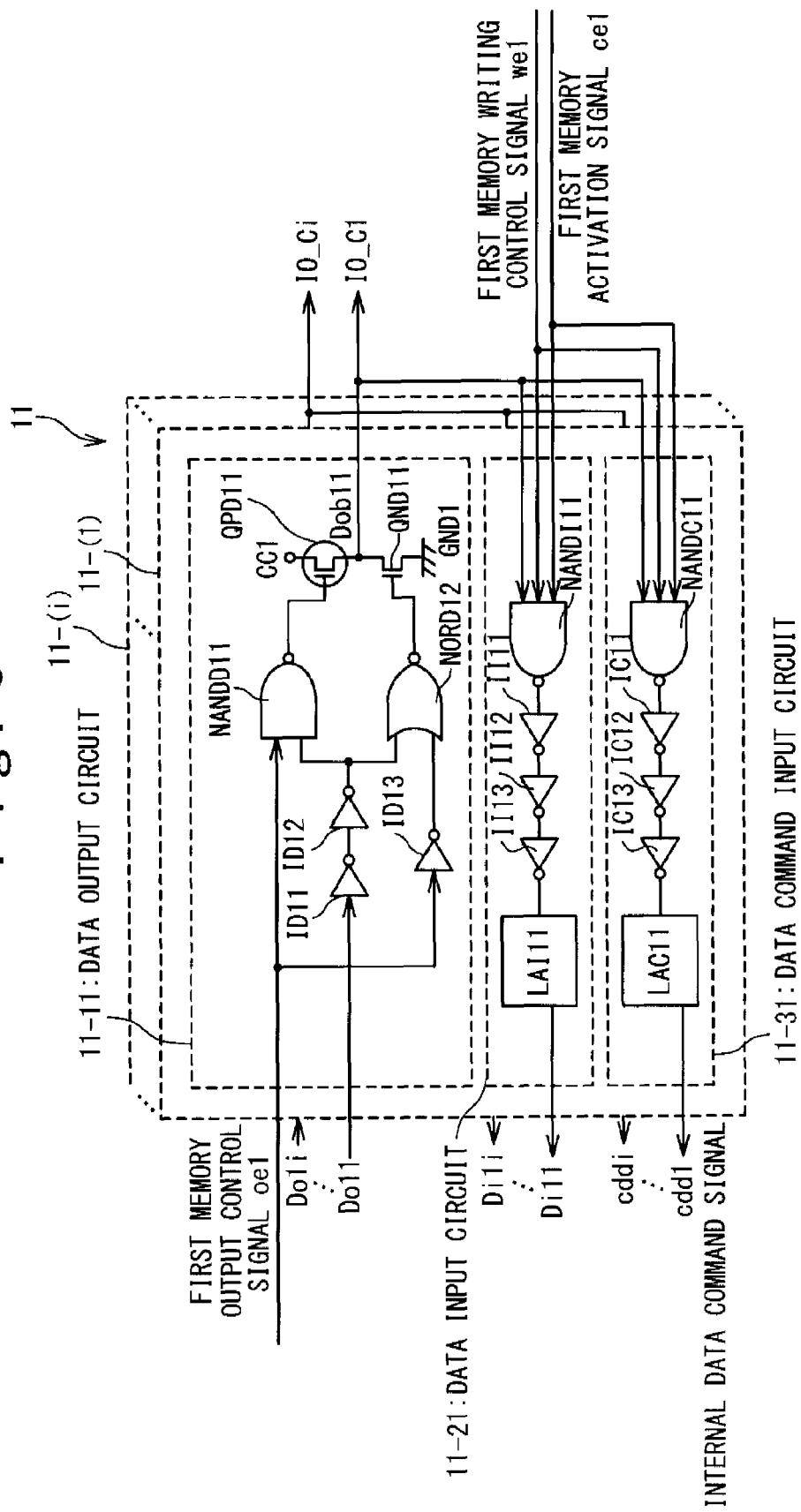
FIG. 3 is a block diagram showing a configuration of a first data input/output circuit 11 in FIG. 1.

FIG. 3 is a block diagram showing a configuration of the first data input/output circuit 11 in FIG. 1. The first data input/output circuit 11 includes partial circuits 11-(1) to 11-(i) having the same configuration, which are connected to the external input/output terminals IO_C1 to IO_Ci, respectively. Although only the partial circuit 11-(1) is described in detail, the partial circuits 11-(2) to 11-(i) have the same configuration as the partial circuit 11-(1).

The partial circuit 11-(1) of the first data input/output circuit 11 includes a data output circuit 11-11, a data input circuit 11-21 and a data command input circuit 11-31, which are connected to the input/output terminal IO_C1. Similarly, each of the partial circuits 11-(2) to 11-(i) of the first data input/output circuit 11 includes a data output circuit 11-11, a data input circuit 11-21 and a data command input circuit 11-31, which are connected to corresponding one of the input/output terminals IO_C2 to IO_Ci.

The data output circuit 11-11 of the partial circuit 11-(1) receives the first output internal data Do11 outputted from the first memory circuit 10 and a first memory output control signal oe1 outputted from the first control circuit 13, and outputs an output signal Dob11 to the input/output terminal IO_C1. Similarly, the data output circuit 11-11 of each of the partial circuits 11-(2) to 11-(i) receives corresponding one of the first output internal data Do12 to Do1i outputted from the first memory circuit 10 and the first memory output control signal oe1 outputted from the first control circuit 13, and outputs corresponding one of the output signals Dob12 to Dob1i to corresponding one of the input/output terminals IO_C2 to IO_Ci.

The data input circuit 11-21 of the partial circuit 11-(1) receives a signal supplied to the input/output terminal IO_C1, a first memory activation signal ce1 and a first memory writing control signal we1, and outputs the first input internal data Di11 to the first memory circuit 10. Here, the first memory activation signal ce1 and the first memory writing control signal we1 are outputted from the first control circuit 13. Similarly, the data input circuit 11-21 of each of the partial circuits 11-(2) to 11-(i) receives a signal supplied to corresponding one of the input/output terminals IO_C2 to IO_Ci, the first memory activation signal ce1 and the first memory writing control signal we1, and outputs corresponding one of the first input internal data Di12 to Di1i to the first memory circuit 10.

The data command input circuits 11-31 of the partial circuit 11-(1) receives a signal supplied to the input/output terminals IO_C1, the first memory activation signal ce1 and the first memory writing control signal we1, and outputs an internal data command signal cdd1 to the first control circuit 13. Similarly, the data command input circuit 11-31 of each of the partial circuits 11-(2) to 11-(i) receives a signal supplied to corresponding one of the input/output terminals IO_C2 to IO_Ci, and the first memory activation signal ce1 and the first memory writing control signal we1, and outputs corresponding one of internal data command signals cdd2 to cddi to the first control circuit 13.

The data output circuit 11-11, the data input circuit 11-21 and the data command input circuit 11-31 will be described using the partial circuit 11-(1) of the first data input/output circuit 11.

The data output circuit 11-11 includes inverters ID11, ID12, ID13, an NAND circuit NANDD11, an NOR circuit NORD12, a P-channel MOSFET (hereinafter referred to as a P-type transistor) QPD11 and an N-channel MOSFET (hereinafter referred to as an N-type transistor) QND11. The inverter ID11 receives the first output internal data Do11 from the first memory circuit 10. The inverter ID12 receives an output of the inverter ID11. The inverter ID13 receives the first memory output control signal oe1 from the first control circuit 13. The NAND circuit NANDD11 receives the first memory output control signal oe1 from the first control circuit 13 and an output of the inverter ID12. The NOR circuit NORD12 receives the output of the inverter ID12 and an output of the inverter ID13. The P-type transistor QPD11 is connected to a power source CC1 at source thereof and connected to drain of the N-type transistor QND11 at drain thereof. Source of the N-type transistor QND11 is connected to a power source GND1. That is, the N-type transistor QND11 is grounded. A gate of the grounded P-type transistor QPD11 is connected to an output of the NAND circuit NANDD11, a gate of the N-type transistor QND11 is connected to an output of the NOR circuit NORD12. The drains of the P-type transistor QPD11 and the N-type transistor QND11 output the output signal Dob11 as an output to the input/output terminal IO_C1.

The data input circuit 11-21 includes an NAND circuit NANDI11, inverters II11, II12, II13 and a latch circuit LAI11. The NAND circuit NANDI11 receives the signal supplied to the input/output terminal IO_C1, the first memory activation signal ce1 and the first memory writing control signal we1. The inverter II11 receives an output of the NAND circuit NANDI11, the inverter II12 receives an output of the inverter II11 and the inverter II13 receives an output of the inverter II12. The latch circuit LAI11 receives an output of the inverter II13 and outputs the first input internal data Di11 as an output to the first memory circuit 10.

The command input circuit 11-31 includes an NAND circuit NANDC11, inverters IC11, IC12, IC13 and a latch circuit LAC11. The NAND circuit NANDC11 receives the signal supplied to the input/output terminal IO_C1, the first memory activation signal ce1 and the first memory writing control signal we1. The inverter IC11 receives an output of the NAND circuit NANDC11, the inverter IC12 receives an output of the inverter IC11 and the inverter IC13 receives an output of the inverter IC12. The latch circuit LAC11 receives an output of the inverter IC13 and outputs the internal data command signals cdd1 as an output to the first control circuit 13.

Figure 4:
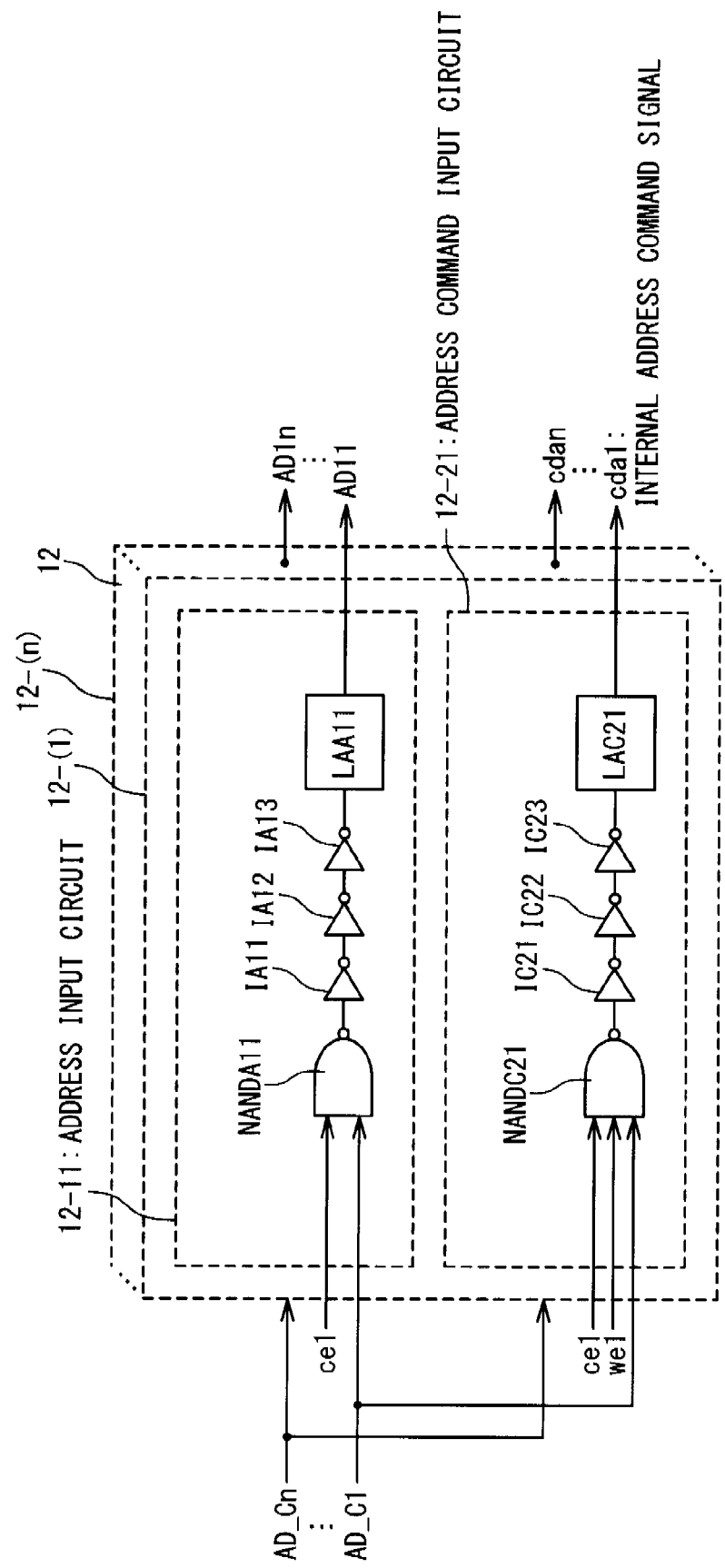
FIG. 4 is a block diagram showing a configuration of a first address latch circuit 12 in FIG. 1.

FIG. 4 is a block diagram showing a configuration of the first address latch circuit 12 in FIG. 1. The first address latch circuit 12 includes partial circuits 12-(1) to 12-(n) having the same configuration, which are connected to the external address terminals AD_C1 to AD_Cn, respectively. Although only the partial circuit 12-(1) is described in detail for simplification of description, the partial circuits 12-(2) to 12-(i) have the same configuration as the partial circuit 12-(1).

The partial circuit 12-(1) of the first address latch circuit 12 includes an address input circuit 12-11 and an address command input circuit 12-21 which are connected to address terminal AD_C1. Similarly, each of the partial circuits 12-(2) to 12-(n) of the first address latch circuit 12 includes an address input circuit 12-11 and an address command input circuit 12-21 which are connected to corresponding one of address terminals AD_C2 to AD_Cn.

The address input circuit 12-11 of the partial circuit 12-(1) receives a signal supplied to the address terminal AD_C1 and the first memory activation signal ce1 outputted from the first control circuit 13, and outputs the first internal address signal Ad11 to the first memory circuit 10. Similarly, the address input circuit 12-11 of each of the partial circuits 12-(2) to 12-(n) receives a signal supplied to corresponding one of the address terminals AD_C2 to AD_Cn and the first memory activation signal ce1, and outputs corresponding one of the first internal address signals Ad12 to Ad1n to the first memory circuit 10.

The address command input circuit 12-21 of the partial circuit 12-(1) receives the signal supplied to the address terminal AD_C1, the first memory activation signal ce1 and the memory writing control signal we1, and outputs the internal address command signal cda1 to the first control circuit 13 and the erasure time setting register 14. Similarly, the address command input circuit 12-21 of each of the partial circuits 12-(2) to 12-(n) receives the signal supplied to corresponding one of the address terminals AD_C2 to AD_Cn, the first memory activation signal ce1 and the memory writing control signal we1, and outputs corresponding one of the internal address command signals cda2 to cdan to the first control circuit 13 and the erasure time setting register 14.

The above-mentioned address input circuit 12-11 and the address command input circuit 12-21 will be described using the partial circuit 12-(1) of the first address latch circuit 12.

The address input circuit 12-11 includes an NAND circuit NANDA11, inverters IA11, IA12, IA13 and a latch circuit LAA11. The NAND circuit NANDA11 receives the signal supplied to the address terminal AD_C1 and the first memory activation signal ce1 outputted from the first control circuit 13. The inverter IA11 receives an output of the NAND circuit NANDA11, the inverter IA12 receives an output of the inverter IA11 and the inverter IA13 receives an output of the inverter IA12. The latch circuit LAA11 receives an output of the inverter IA13 and outputs the first internal address signals Ad11 as an output to the first memory circuit 10.

The address command input circuit 12-21 includes an NAND circuit NANDC21, inverters IC21, IC22, IC23 and a latch circuit LAC21. The NAND circuit NANDC21 receives the signal supplied to the address terminal AD_C1, the first memory activation signal ce1 and the first memory writing control signal we1. The inverter IC21 receives an output of the NAND circuit NANDC21, the inverter IC22 receives an output of the inverter IC21 and the inverter IC23 receives an output of the inverter IC22. The latch circuit LAC21 receives an output of the inverter IC23 and outputs the internal address command signals cda1 as an output to the first control circuit 13 and the erasure time setting register 14.

Figure 5:
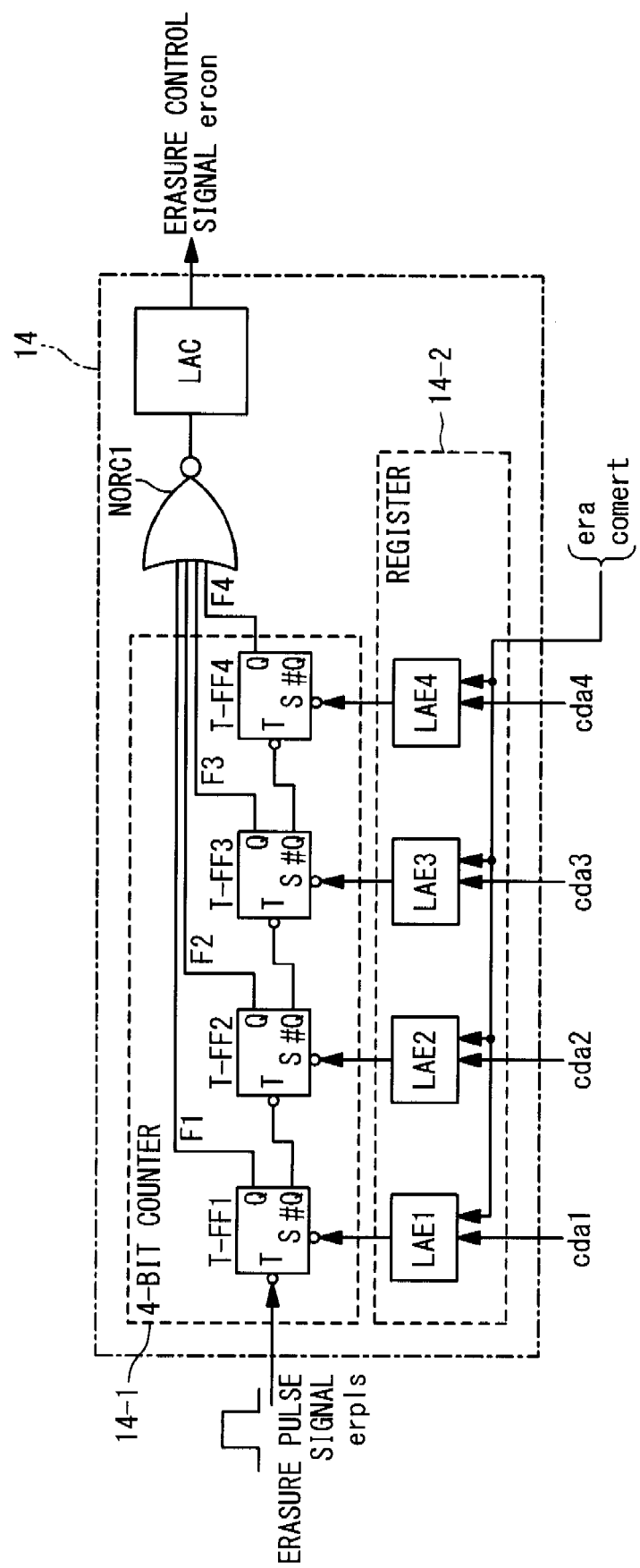
FIG. 5 is a block diagram showing a configuration of an erasure time setting register 14 in FIG. 1.

FIG. 5 is a block diagram showing a configuration of the erasure time setting register 14 in FIG. 1. The erasure time setting register 14 includes a 4-bit counter 14-1 (here, the above-mentioned n=4 as an example), a register 14-2, an NOR circuit NORC1 and a latch circuit LAC. The 4-bit counter 14-1 includes T-flip-flops (hereinafter referred to as flip-flop) T-FF1, T-FF2, T-FF3, T-FF4. The register 14-2 includes latch circuits LAE1, LAE2, LAE3, and LAE4.

The latch circuits LAE1 to LAE4 receive the internal address command signals cda1 to cda4, respectively. Here, the internal address command signals cda1 to cda4 are outputted from the partial circuits 12-(1) to 12-(4) of the first address latch circuit 12, respectively. The latch circuit LAE1 to LAE4 also receives a data input mode signal comert and an erasure mode signal era which are outputted from the first control circuit 13. In a data input mode of the erasure time setting register 14, a signal level of the data input mode signal comert becomes a high level "H" and a signal level of the erasure mode signal era becomes a low level "L". On the other hand, in an erasure mode of the erasure time setting register 14, the signal level of the data input mode signal comert becomes the low level "L" and the signal level of the erasure mode signal era becomes the high level "H".

An erasure pulse signal erpls is supplied to a clock input terminal T of the flip-flop T-FF1 and an output of the latch circuit LAE1 is supplied to a set terminal S of the flip-flop T-FF1. An inverted output #Q of the flip-flop T-FF1 is supplied to a clock input terminal T of the flip-flop T-FF2 and an output of the latch circuit LAE2 is supplied to a set terminal S of the flip-flop T-FF2. An inverted output #Q of the flip-flop T-FF2 is supplied to a clock input terminal T of the flip-flop T-FF3 and an output of the latch circuit LAE3 is supplied to a set terminal S of the flip-flop T-FF3. An inverted output #Q of the flip-flop T-FF3 is supplied to a clock input terminal T of the flip-flop T-FF4 and an output of the latch circuit LAE4 is supplied to a set terminal S of the flip-flop T-FF4. The NOR circuit NORC1 receives outputs Q of the flip-flops T-FF1, T-FF2, T-FF3, T-FF4 as output signals F1, F2, F3, F4, respectively. The latch circuit LAC receives an output of the NOR circuit NORC1 and outputs an erasure control signal ercon as an output.

Figure 7:
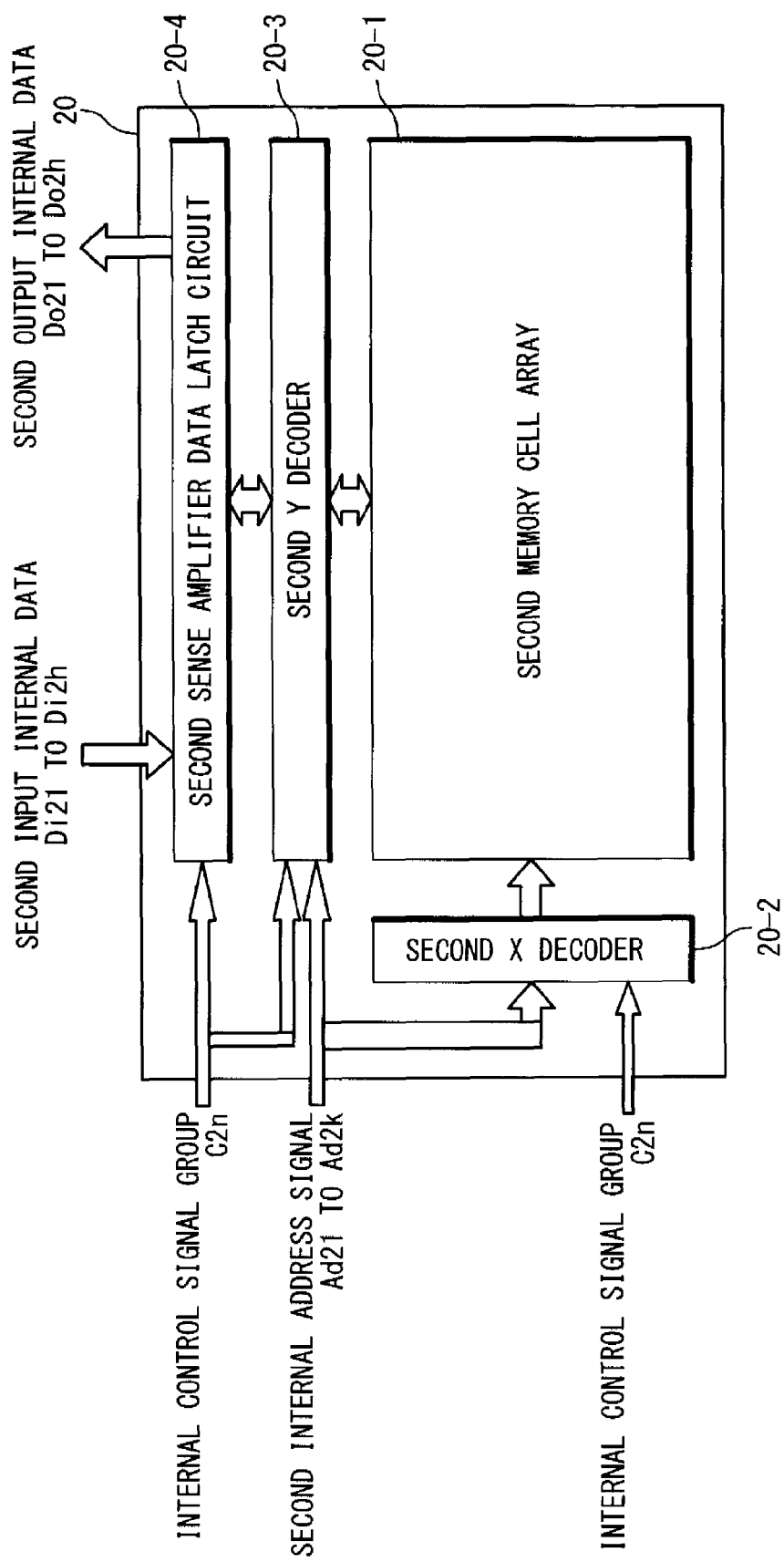
FIG. 7 is a block diagram showing a configuration of a second memory circuit 20 in FIG. 1.

FIG. 7 is a block diagram showing a configuration of the second memory circuit in FIG. 1. The second memory circuit 20 includes a second memory cell array 20-1, a second X decoder 20-2, a second Y decoder 20-3 and a second sense amplifier data latch circuit 20-4. In the second memory cell array 20-1, RAM memory cells are arranged in matrix. The second X decoder 20-2 receives second internal address signals Ad21 to Ad2$k$ (k is an integer, k=m+n) as outputs of the second address latch circuit 22 and an internal control signal group C2$n$ as an output of the second control circuit 23, and selects an X address of the second memory cell array 20-1. The second Y decoder 20-3 receives the second internal address signals Ad21 to Ad2$k$ and the internal control signal group C2$n$, and selects an Y address of the second memory cell array 20-1. The second sense amplifier data latch circuit 20-4 receives the internal control signal group C2$n$. Then, the second sense amplifier data latch circuit 20-4 supplies second output internal data Do21 to Do2$h$ (h is an integer, h=i+j) as data read from the second memory cell array 20-1 to the second data input/output circuit 21 in reading operation. The second sense amplifier data latch circuit 20-4 writes second input internal data Di21 to Di2$h$ as data to be written to the second memory cell array 20-1 in writing operation.

Figure 8:
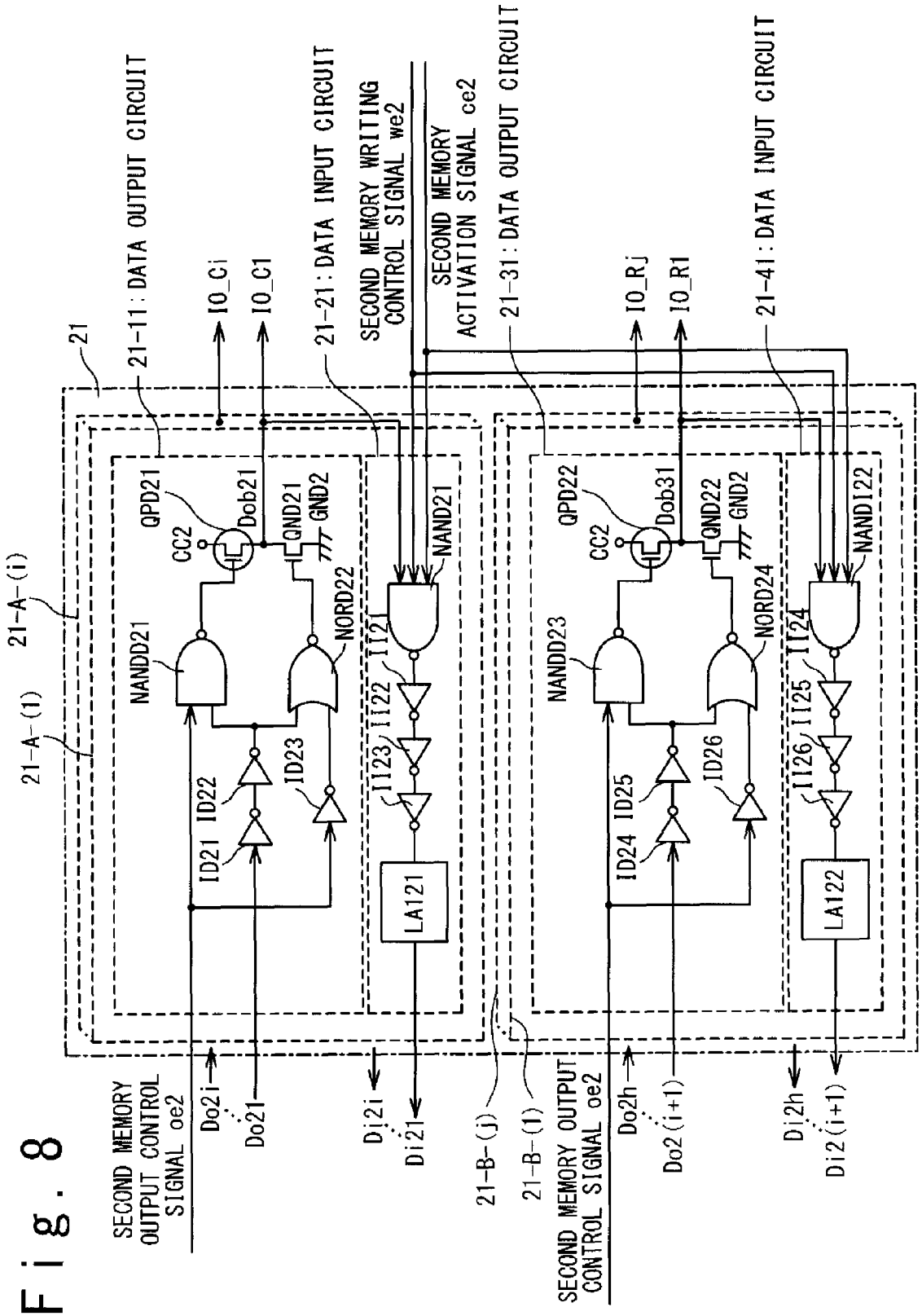
FIG. 8 is a block diagram showing a configuration of a second data input/output circuit 21 in FIG. 1.

FIG. 8 is a block diagram showing a configuration of the second data input/output circuit 21 in FIG. 1. The second data input/output circuit 21 includes first partial circuits 21-A-(1) to 21-A-(i) of the same configuration and second partial circuits 21-B-(1) to 21-B-(j) of the same configuration. Here, the first partial circuits 21-A-(1) to 21-A-(i) are connected to the external input/output terminals IO_C1 to IO_Ci, respectively. The second partial circuits 21-B-(1) to 21-B-(j) are connected to the external input/output terminals IO_R1 to IO_Rj, respectively. Although only the first partial circuit 21-A-(1) and the second partial circuit 21-B-(1) are shown in detail for simplification of description, the first partial circuits 21-A-(2) to 21-A-(i) and the second partial circuits 21-B-(2) to 21-B-(j) has the same configuration as the first partial circuit 21-A-(1) and the second partial circuit 21-B-(1), respectively.

The first partial circuit 21-A-(1) of the second data input/output circuit 21 includes a data output circuit 21-11 and a data input circuit 21-21 which are connected to the input/output terminal IO_C1. Similarly, each of the first partial circuits 21-A-(2) to (i) of the second data input/output circuit 21 includes a data output circuit 21-11 and a data input circuit 21-21 which are connected to corresponding one of the input/output terminals IO_C2 to IO_Ci.

The data output circuit 21-11 of the first partial circuit 21-A-(1) receives second output internal data D021 outputted from the second memory circuit 20 and a second memory output control signal oe2 outputted from the second control circuit 23, and outputs an output signal Dob21 to the input/output terminal IO_C1. Similarly, the data output circuit 21-11 of each of the first partial circuits 21-A-(2) to (i) receives corresponding one of second output internal data D022 to Do2$i$ outputted from the second memory circuit 20 and the second memory output control signal oe2, and outputs corresponding one of output signals Dob22 to Dob2$i$ to corresponding one of the input/output terminal IO_C2 to IO_Ci.

The data input circuit 21-21 of the partial circuit 21-A-(1) receives the signal supplied to the input/output terminal IO_C1, and the second memory activation signal ce2 and a second memory writing control signal we2 which are output from the second control circuit 23, and outputs the second input internal data Di21 to the second memory circuit 20. Similarly, the data input circuit 21-21 of each of the partial circuits 21-A-(2) to 21-A-(i) receives the signal supplied to corresponding one of the input/output terminal IO_C2 to IO_Ci, the second memory activation signal ce2 and the second memory writing control signal we2, and outputs corresponding one of the second input internal data Di22 to Di2$i$ to the second memory circuit 20.

The second partial circuit 21-B-(1) includes a data output circuit 21-31 and a data input/output circuit 21-41 which are connected to the input/output terminal IO_R1. Similarly, each of the second partial circuits 21-B-(2) to 21-B-(j) includes a data output circuit 21-31 and a data input/output circuit 21-41 which are connected to corresponding one of the input/output terminals IO_R2 to IO_Rj.

The data output circuit 21-31 of the second partial circuit 21-B-(1) receives a second output internal data Do2 (i+1) and the second memory output signal oe2 outputted from the second control circuit 23, and outputs an output signal Dob31 to the input/output terminals IO_R1. Similarly, the data output circuit 21-31 of each of the second partial circuits 21-B-(2) to 21-B-(j) receives corresponding one of second output internal data Do2 (i+2) to Do2$h$ and the second memory output signal oe2, and outputs corresponding one of the output signals Dob32 to Dob3$j$ to corresponding one of the input/output terminals IO_R2 to IO_Rj.

The data input circuit 21-41 of the second partial circuit 21-B-(1) receives the signal supplied to the input/output terminal IO_R1, and the second memory activation signal ce2 and the second memory writing control signal we2, and outputs a second input internal data Di2 (i+1) to the second memory circuit 20. Similarly, the data input circuit 21-41 of each of the second partial circuits 21-B-(2) to 21-B-(j) receives the signal supplied to corresponding to the input/output terminals IO_R2 to IO_Rj, the second memory activation signal ce2 and the second memory writing control signal we2, and outputs corresponding one of second input internal data Di2 (i+2) to Di2$h$ to the second memory circuit 20.

The above-mentioned data output circuit 21-11 and data input circuit 21-21 will be described using the first partial circuit 21-A-(1) of the second data input/output circuit 21 and the above-mentioned data output circuit 21-31 and data input/output circuit 21-41 will be described using the second partial circuit 21-B-(1) of the second data input/output circuit 21.

The data output circuit 21-11 includes inverters ID21, ID22, ID23, an NAND circuit NANDD21, an NOR circuit NORD22, a P-type transistor QPD21 and an N-type transistor QND21. The inverter ID21 receives the second output internal data Do21 from the second memory circuit 20 and the inverter ID22 receives an output of the inverter ID21. The inverter ID23 receives the second memory output control signal oe2 from the second control circuit 23. The NAND circuit NANDD21 receives the second memory output control signal oe2 and an output of the inverter ID22. The NOR circuit NORD22 receives the output of the inverter ID22 and an output of the inverter ID23. The P-type transistor QPD21 is connected to a power source CC2 at source thereof and connected to drain of the N-type transistor QND21 at drain thereof. Source of the N-type transistor QND21 is connected to a power source GND2. That is, the N-type transistor QND21 is grounded. Gate of the P-type transistor QPD21 is connected to an output of the NAND circuit NANDD21, gate of the N-type transistor QND21 is connected to an output of the NOR circuit NORD22 and drains of the P-type transistor QPD21 and the N-type transistor QND21 outputs the output signal Dob21 as an output thereof to the input/output terminal IO_C1.

The data input circuit 21-21 includes an NAND circuit NANDI21, inverters II21, II22, II23 and a latch circuit LAI21. The NAND circuit NANDI21 receives the signal supplied to the input/output terminal IO_C1, the second memory activation signal ce2 and the second memory writing control signal we2. The inverter II21 receives an output of the NAND circuit NANDI21, the inverter II22 receives an output of the inverter II21 and the inverter II23 receives an output of the inverter II22. The latch circuit LAI21 receives an output of the inverter II23 and outputs the second input internal data Di21 as an output thereof to the second memory circuit 20.

The data output circuit 21-31 includes inverters 1D24, ID25, ID26, an NAND circuit NANDD23, an NOR circuit NORD24, a P-type transistor QPD22 and an N-type transistor QND22. The inverter ID24 receives the second output internal data Do2 (i+1) from the second memory circuit 20 and the inverter ID25 receives an output of the inverter ID24. The inverter ID26 receives the second memory output control signal oe2 from the second control circuit 23. The NAND circuit NANDD23 receives the second memory output control signal oe2 and an output of the inverter ID25. The NOR circuit NORD24 receives the output of the inverter ID25 and an output of the inverter ID26. The P-type transistor QPD22 is connected to the power source CC2 at source thereof and connected to drain of the N-type transistor QND22 at drain thereof. A source of the N-type transistor QND22 is connected to the power source GND2. That is, the N-type transistor QND22 is grounded. Gate of the P-type transistor QPD22 is connected to an output of the NAND circuit NANDD23, gate of the N-type transistor QND22 is connected to an output of the NOR circuit NORD24 and drains of the P-type transistor QPD22 and the N-type transistor QND22 output the output signal Dob31 as an output to the input/output terminal IO_C1.

The data input circuit 21-41 includes an NAND circuit NANDI24, inverters II24, II25, II26 and a latch circuit LAI22. The NAND circuit NANDI24 receives the signal supplied to the input/output terminal IO_R1, the second memory activation signal ce2 and the second memory writing control signal we2. The inverter II24 receives an output of the NAND circuit NANDI24, the inverter II25 receives the output of the NAND circuit NANDI24 and the inverter II26 receives an output of the inverter II25. The latch circuit LAI22 receives an output of the inverter II26 and outputs the second input internal data Di2 (1+i) as an output to the second memory circuit 20.

Figure 9:
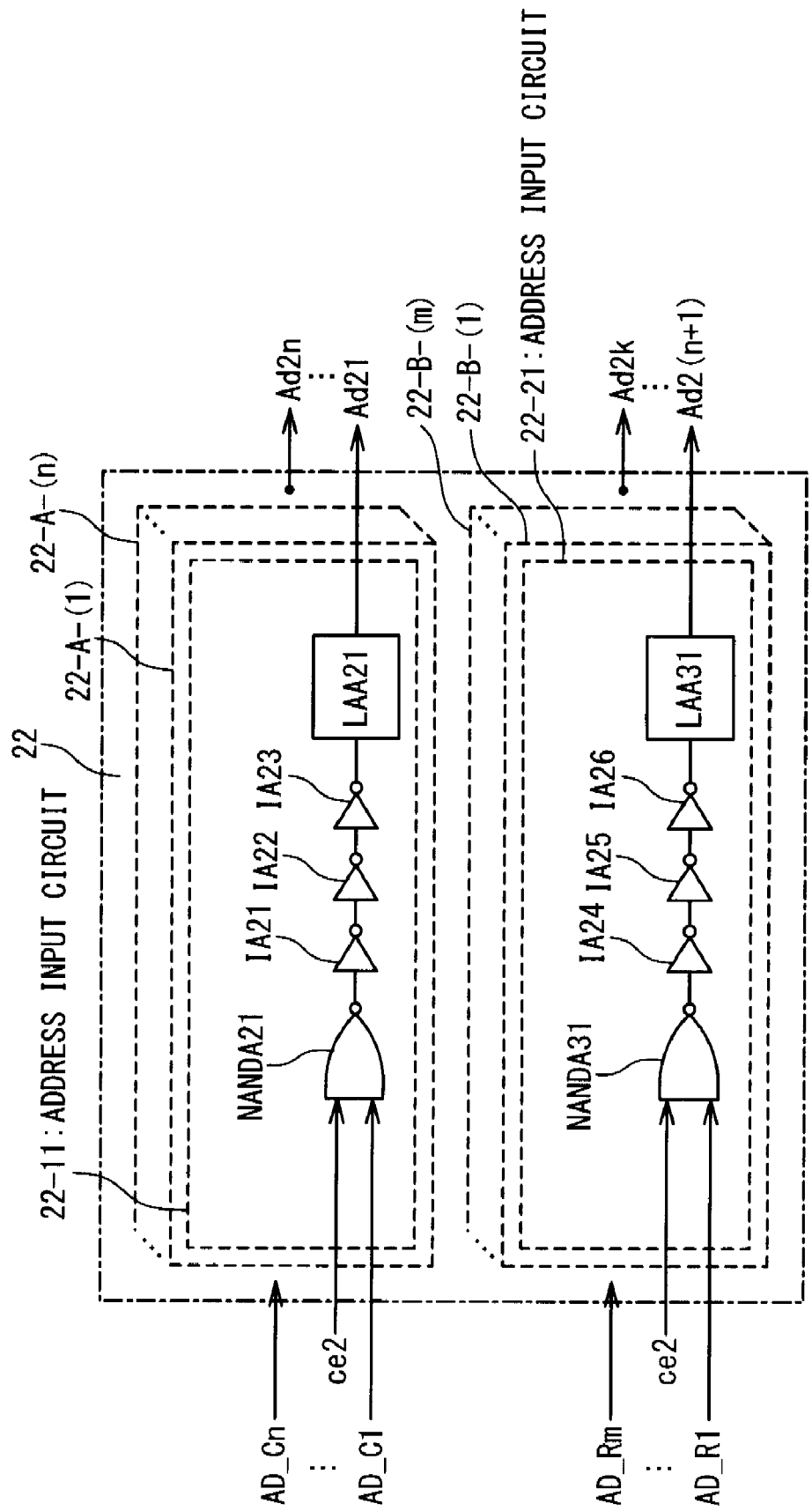
FIG. 9 is a block diagram showing a configuration of a second address latch circuit 22 in FIG. 1.

FIG. 9 is a block diagram showing a configuration of the second address latch circuit 22 in FIG. 1. The second address latch circuit 22 includes first partial circuits 22-A-(1) to 22-A-(n) of the same configuration connected to the external address terminals AD_C1 to AD_Cn, respectively, and second partial circuits 22-B-(1) to 22-B-(m) of the same configuration connected to the external address terminals AD_R1 to AD_Rm, respectively. Although the first partial circuit 22-A-(1) and the second partial circuit 22-B-(1) are shown in detail for simplification, the first partial circuit 22-A-(2) to 22-A-(n) and the second partial circuits 22-B-(2) to (m) have the same configuration as the first partial circuit 22-A-(1) and the second partial circuit 22-B-(1), respectively.

The first partial circuit 22-A-(1) of the second address latch circuit 22 includes an address input circuit 22-11 which is connected to the external address terminal AD_C1. Similarly, each of the first partial circuits 22-A-(2) to 22-A-(n) of the second address latch circuit 22 includes an address input circuit 22-11 which is connected to corresponding one of the external address terminals AD_C2 to AD_Cn.

The second partial circuit 22-B-(1) of the second address latch circuit 22 includes an address input circuits 22-21 which is connected to the external address terminal AD_R1. Similarly, each of the second partial circuits 22-B-(2) to 22-B-(m) of the second address latch circuit 22 includes an address input circuit 22-21 which is connected to corresponding one of the external address terminals AD_R2 to AD_Rm.

The address input circuit 22-11 of the first partial circuit 22-A-(1) receives the signal supplied to the external address terminal AD_C1 and the second memory activation signal ce2 outputted from the second control circuit 23, and outputs a second internal address signal Ad21 to the second memory circuit 20. Similarly, the address input circuit 22-11 of each of the first partial circuits 22-A-(2) to 22-A-(n) receives the signal supplied to corresponding one of the external address terminals AD_C2 to AD_Cn and the second memory activation signal ce2, and outputs corresponding one of second internal address signals Ad22 to Ad2n to the second memory circuit 20.

The address input circuit 22-21 of the second partial circuit 22-B-(1) receives the signal supplied to the address terminal AD_R1, and the second memory activation signal ce2 and the second memory writing control signal we2 outputted from the second control circuit 23, and outputs the second internal address signal Ad2 (n+1) to the second memory circuit 20. Similarly, the address input circuit 22-21 of each of the second partial circuits 22-B-(2) to 22-B-(m) receives the signal supplied to corresponding one of the address terminals AD_R2 to AD_Rm, and the second memory activation signal ce2 and the second memory writing control signal we2, and outputs corresponding one of the second internal address signals Ad2 (n+2) to Ad2k to the second memory circuit 20.

The address input circuit 22-11 includes an NAND circuit NANDA21, inverters IA21, IA22, IA23 and a latch circuit LAA21. The NAND circuit NANDA21 receives the signal supplied to the address terminal AD_C1 and the second memory activation signal ce2 output from the second control circuit 23. The inverter IA21 receives an output of the NAND circuit NANDA21, the inverter IA22 receives an output of the NAND circuit NANDA21 and the inverter IA23 receives an output of the inverter IA22. The latch circuit LAA21 receives an output of the inverter IA23 and outputs the second internal address signals Ad21 as an output thereof to the second memory circuit 20.

The address input circuit 22-21 includes an NAND circuit NANDA24, inverter IA24, IA25, IA26 and a latch circuit LAA31. The NAND circuit NANDA31 receives the signal supplied to the address terminal AD_C1 and the second memory activation signal ce2 output from the second control circuit 23. The inverter IA24 receives an output of the NAND circuit NANDA31, the inverter IA25 receives an output of the inverter IA24 and the inverter IA26 receives an output of the inverter IA25. The latch circuit LAA31 receives an output of the inverter IA26 and outputs the second internal address signal Ad2 (n+1) as an output thereof to the second memory circuit 20.

[Operations]

Operations of the semiconductor device 100 according to the first embodiment of the present invention will be described. In the present embodiment, a case where a data holding test (or hold test) of the RAM 102 is conducted in a "plural sectors erasure test" period of the flash memory 101 will be described. Here, the plural sectors erasure test period is the period during which data stored in selected sectors (part or all of sectors) selected from a plurality of sectors in the flash memory 101 are erased. In the plural sectors erasure test, the case where data in a sector 1 (SEC 1), a sector 2 (SEC 2) and a sector 3 (SEC 3) as the selected sectors are serially erased in this order will be described. In the data holding test, a writing/reading test (hereinafter referred to as a W/R test) of the RAM 102 will be described.

Figure 11:
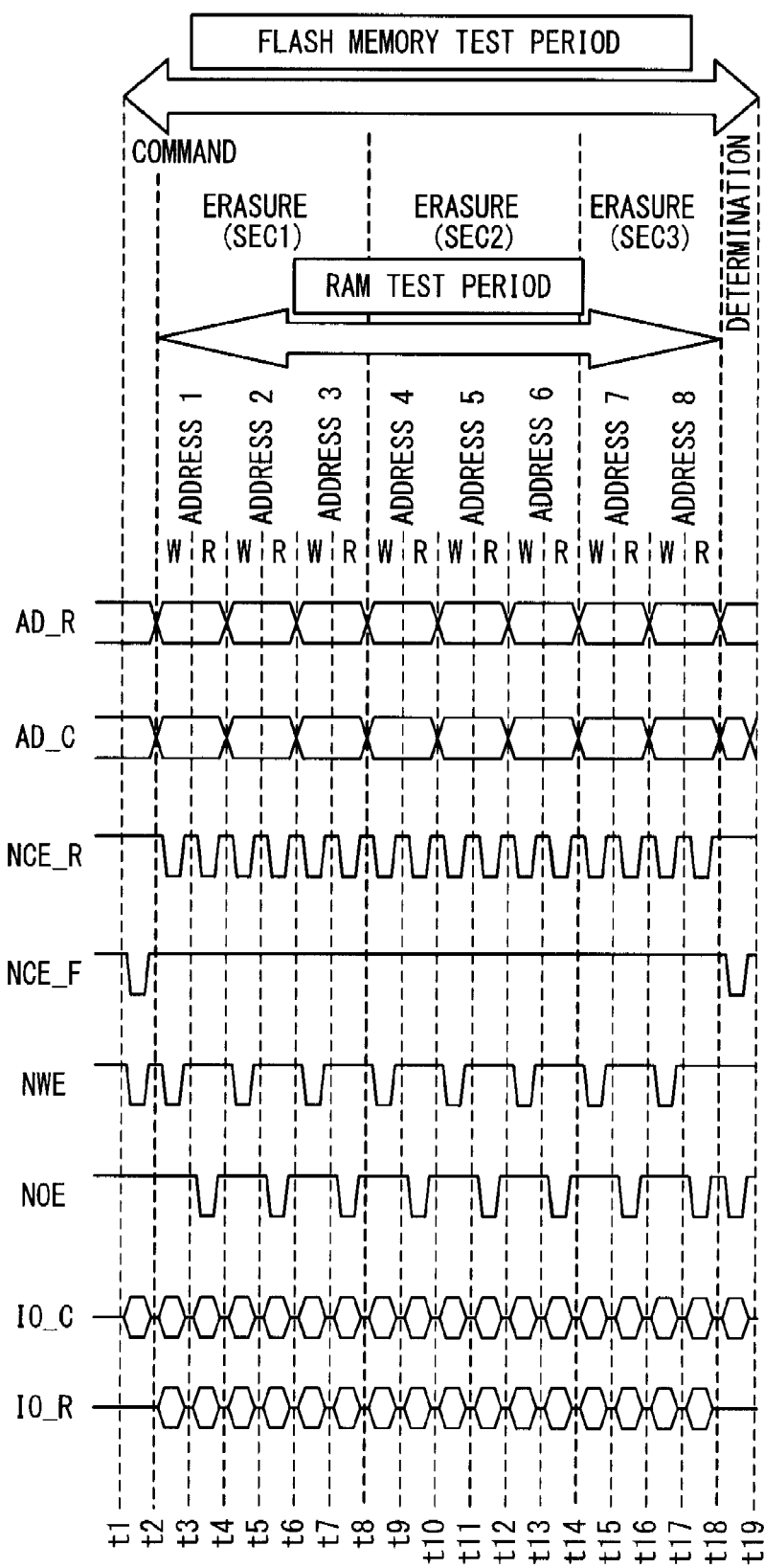
FIG. 11 is a timing chart showing signals supplied to each external terminal of the semiconductor device 100 when a plural sectors erasure test and a W/R test are simultaneously conducted.

FIG. 11 is a timing chart showing signals supplied to each external terminal of the semiconductor device 100 when the plural sectors erasure test and the W/R test are simultaneously conducted. A signal {AD_R} represents a signal supplied to each of the external address terminals AD_R1 to AD_Rm. A signal {AD_C} represents a signal supplied to each of the external address terminals AD_C1 to AD_Cn. A signal {NCE_R} represents a signal supplied to the external control terminal NCE_R. The signal {NCE_F} represents a signal supplied to the external control terminal NCE_F. A signal {NWE} represents a signal supplied to the external control terminal NWE. A signal {NOE} represents a signal supplied to the external control terminal NOE. A signal {IO_C} represents a signal supplied to each of the external input/output terminals IO_C1 to IO_C. A signal {IO_R} represents a signal supplied to each of the external input/output terminals IO_R1 to IO_Rj.

Figure 12:
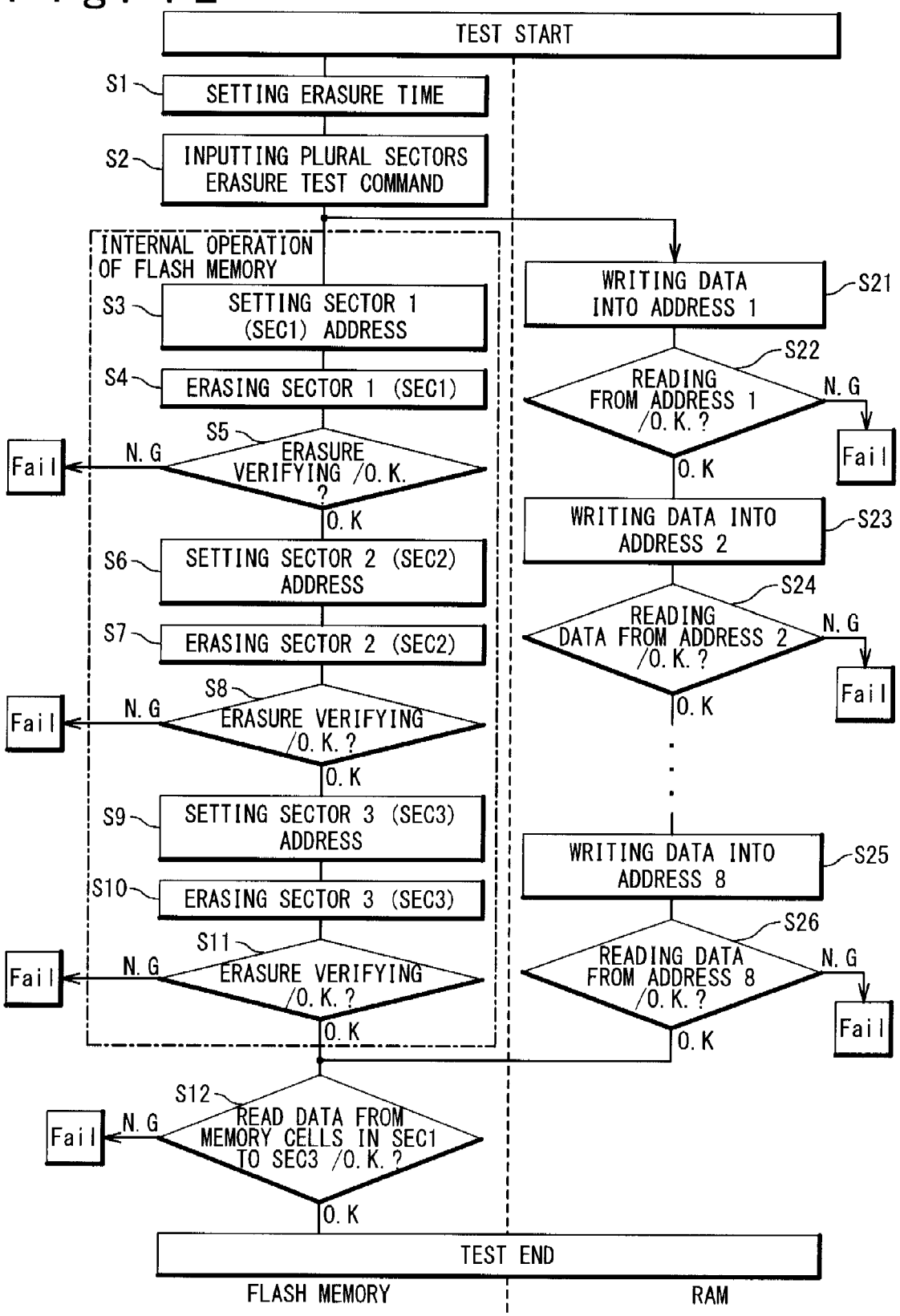
FIG. 12 is a flow chart showing operations of the semiconductor device 100 when the plural sectors erasure test and the W/R test are simultaneously conducted.

FIG. 12 is a flow chart showing an operation of the semiconductor device 100 when the plural sectors erasure test and the W/R test are simultaneously conducted. As shown in FIG. 12, in the present embodiment, at the start of the test, a sector erasure assurance time is set in the erasure time setting register 14. Here, the sector erasure assurance time is an assurance value of sector erasure time for determining non-defective unit/defective unit. The time is set to internally determine whether or not data erasure in each sector is finished within the assurance time when data stored in a plurality of sectors is serially erased. If the sector erasure assurance time is not set, even though the sector with the erasure time which is longer than the sector erasure assurance time exists, the unit cannot be rejected as a defective unit. This will be described in detail later referring to FIG. 12.

First, referring to F*igs*. 5 and 6, operations of the sector erasure time setting register 14 will be described. In the present embodiment, a case where the above-mentioned n is four (4) and the sector erasure assurance time is set in the sector erasure time setting register 14 from four external address terminals AD_C1 to AD_C4 will be described.

(Operation 1)

First, a command to input data to the erasure time setting register 14 is supplied to the external address terminals AD_C1 to AD_C4. This command is recognized by the first control circuit 13 through the address terminals AD_C1 to AD_C4 and the first address latch circuit 12. At this time, the erasure control signal ercon shown in FIG. 5 becomes "H" and the first control circuit 13 sets the erasure time setting register 14 to a data input mode. Next, all signals {AD_C} supplied to the external address terminals AD_C1 to AD_C4 are made to "H". Thus, all of the internal address command signals cda1 to cda4 become "H" and the latch circuits LAE1 to LAE4 of the register 14-2 hold data "1 (H)" (step S1 in FIG. 12).

(Operation 2)

Next, the first control circuit 13 sets the erasure time setting register 14 to the erasure mode (steps succeeding the step S2 in FIG. 12, details will be later) When the erasure mode signal era becomes "H", a data "1 (H)" in each of the latch circuits LAE1 to LAE4 is transferred to corresponding one of the flip-flops T-FF1 to T-FF4 of the 4-bit counter 14-1. An output #Q of each of the flip-flop T-FF1 to T-FF4 is initialized to "1 (H)", an output of the NOR circuit NORC1 becomes "L" and the erasure control signal ercon becomes "L" (at time t21 in FIG. 6).

(Operation 3)

Next, when the erasure pulse signal erpls is supplied to the clock input terminal T of the flip-flop T-FF1, the signal is sequentially divided at the flip-flops T-FF1 to T-FF4. When all outputs #Q of the flip-flops T-FF1 to T-FF4 become "0 (L)", an output of the NOR circuit NORC1 becomes "H" and the erasure control signal ercon becomes "H" (at time t22 after time t21 in FIG. 6).

(Operation 4)

Figure 6:
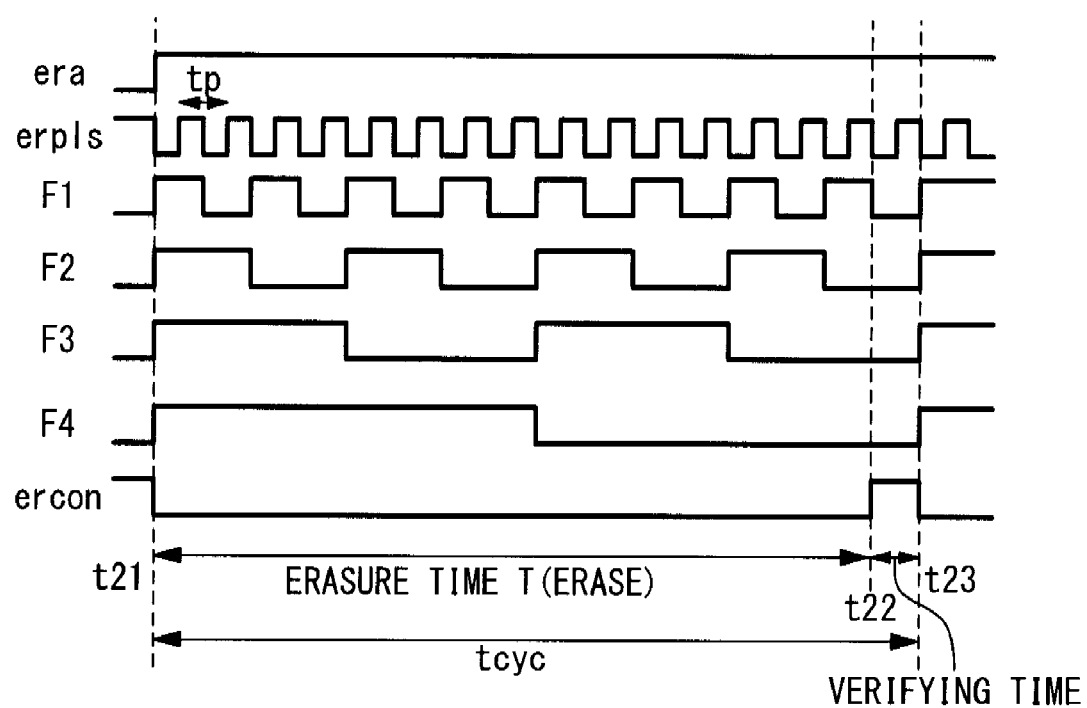
FIG. 6 is a timing chart showing an operation of an erasure time setting register 14 in FIG. 1.

Furthermore, when the erasure pulse signal erpls advances by 1 cycle from the time t22, all outputs #Q of the flip-flops T-FF1 to T-FF4 become "1 (H)" and the erasure control signal ercon becomes "L" (at time t23 in FIG. 6). Thereafter, operations from t21 to t23 (tcyc) are repeated. That is, in the erasure control signal ercon, a pulse protruding downward is generated as an output in the time period shown in an equation (1). By setting this time period as the sector erasure assurance time, the erasure operation in the flash memory 101 can be controlled.

$$t(\text{erase}) = 15 \times tp \quad (1)$$

Here, tp is cycle time of the erasure pulse signal erpls and "15" is set to a value when the 4-bit counter is applied. Generally, in the case of an n-bit counter, t(erase) is represented by an equation (2).

$$t(\text{erase}) = (2^n - 1) \times tp \quad (2)$$

In a case of the 4-bit counter shown in FIG. 5, when the assurance value (sector erasure assurance time) of the erasure time of the flash memory 101 is, for example, 500 msec according to the equation (1), if tp is set to 33 msec, t(erase) becomes 495 msec. When data stored in the sector are erased within t(erase), it can be determined that the sector erasure assurance time is satisfied.

Next, a specific operation in the case where the W/R test of the RAM 102 is conducted in the "plural sectors erasure test" period will be described. Here, during the "plural sectors erasure test" period, data stored in the sector 1 (SEC 1), the sector 2 (SEC 2) and sector 3 (SEC 3) as the above-mentioned selected sectors of the flash memory 101 are serially erased in this order (steps succeeding the step S2 in FIG. 12)

(Operation 1)

In the period from time t1 to t2 in FIG. 11, the signal {NCE_F} is set to "L", the signal {NCE_R} is set to "H", the flash memory 101 is activated and the RAM 102 is deactivated. At this time, the first memory activation signal ce1 becomes "H", and the first data input/output circuit 11 and the first address latch circuit 12 in the flash memory 101 shown in FIG. 1 are activated. The second memory activation signal ce2 becomes "L", and the second data input/output circuit 21 and the second address latch circuit 22 in the RAM 102 shown in FIG. 1 are deactivated. When the signal {NWE} is made to "L" and commands to execute the "plural sectors erasure test" are supplied from the signal {AD_C} and the signal {IO_C}, the first memory writing control signal we1 becomes "H". Then, the data input circuit 11-21 and the data command circuit 11-31 in the first data input/output circuit 11 shown in FIG. 3 are activated and the commands are taken into the first control circuit 13 shown in FIG. 1 (step S2 in FIG. 12). Next, addresses of sectors to be erased (in the present embodiment, the SEC 1, the SEC 2 and the SEC 3) are supplied from the signal {AD_C}, the addresses are taken into the first control circuit 13. When these commands and addresses are supplied, the flash memory 101 is set to the erasure mode by the first control circuit 13, the erasure mode signal era shown in FIG. 10 becomes "H", the erasure pulse signal erpls is generated, the SEC 1 is selected according to the first internal address signals Ad11 to Ad1*n* and the SEC 1 is erased (step S3 in FIG. 12).

(Operation 2)

In an erasure period of the SEC 1 of the flash memory 101 (step S4 in FIG. 12), in the period from time t2 to t3 in FIG. 11, the signal {NCE_R} is made to "L", the signal {NCE_F} is made to "H", the RAM 102 is activated and the flash memory 101 is deactivated. At this time, the second memory activation signal ce2 becomes "H", and the second data input/output circuit 21 and the second address latch circuit 22 of the RAM 102 shown in FIG. 1 are activated. The first data input/output circuit 11 and the first address latch circuit 12 of the flash memory 101 are deactivated. Furthermore, the signal {NWE} is made to "L" and an address to be written (address 1) is supplied to the external address terminals AD_C1 to AD_Cn and the external address terminals AD_R1 to AD_Rm as the signal {AD_C} and the signal {AD_R}. At this time, the second memory writing control signal we2 becomes "H", data input circuits 21-21, 21-41 of the second data input/output circuit 21 shown in FIG. 8 are activated, target memory cells are selected, and data supplied to the external input/output terminals IO_C1 to IO_Ci and the external input/output terminals IO_R1 to IO_Rj as the signal {IO_C} and the signal {IO_R} are written to the second memory circuit 20 through the data input circuits 21-21, 21-41 (step S21 in FIG. 12).

(Operation 3)

In a period from time t3 to t4, the signal {NCE_R} is made to "L", the signal {NCE_F} is made to "H", the RAM 102 is activated and the flash memory 101 is deactivated. By setting the signal {NOE} to "L", the second memory output control signal oe2 becomes "H", the data output circuits 21-11, 21-31 of the second data input/output circuit 21 shown in FIG. 8 are activated and data are read from the memory cells at the address 1 as read data. The read data are outputted to the external input/output terminals IO_C1 to IO_Ci and the external input/output terminals IO_R1 to IO_Rj as the signal {IO_C} and the signal {IO_R} through the data output circuits 21-11, 21-31 and it is determined whether or not the read data correspond to written data by a tester (step S22 in FIG. 12).

(Operation 4)

Subsequently, in the erasure period of the SEC 1 of the flash memory 101 (step S4 in FIG. 12), in a period from time t4 to t5, the signal {NCE_R} is made to "L", the signal {NCE_F} is made to "H", the RAM 102 is activated and the flash memory 101 is deactivated. At this time, the second memory activation signal ce2 becomes "H", the second data input/output circuit 21 and the second address latch circuit 22 of the RAM 102 shown in FIG. 1 are activated and the first data input/output circuit 11 and the first address latch circuit 12 of the flash memory 101 are deactivated. Furthermore, the signal {NWE} is made to "L", an address to be written (address 2) is supplied to the external address terminals AD_C1 to AD_Cb and the external address terminals AD_R1 to AD_Rm as the signal {AD_C} and the signal {AD_R}. At this time, the second memory writing control signal we2 becomes "H", data input circuits 21-21, 21-41 are activated, target memory cells are selected, data supplied to the external input/output terminals IO_C1 to IO_Ci and the external input/output terminals IO_R1 to IO_Rj as the signal {IO_C} and the signal {IO_R} are written to the first memory circuit 10 through the data input circuits 21-21, 21-41 as written data (step S23 in FIG. 12).

(Operation 5)

In a period from time t5 to t6, the signal {NCE_R} is made to "L", the signal {NCE_F} is made to "H", the RAM 102 is activated and the flash memory 101 is deactivated. By setting the signal {NOE} to "L", the second memory output control signal oe2 becomes "H", the data output circuits 21-11, 21-31 of the second data input/output circuit 21 shown in FIG. 8 are activated and data are read from memory cells of the address 2 as read data. The read data are outputted to the external input/output terminals IO_C1 to IO_Ci and the external input/output terminals IO_R1 to IO_Rj as the signal {IO_C} and the signal {IO_R} through the data output circuits 21-11, 21-31. It is determined whether or not the read data correspond to the written data by the tester (step S24 in FIG. 12).

(Operation 6)

Subsequently, in the erasure period of the SEC 1 of the flash memory 101 (step S4 in FIG. 12), in a period from time t6 to t7, the signal {NCE_R} is made to "L", the signal {NCE_F} is made to "H", the RAM 102 is activated and the flash memory 101 is deactivated. At this time, the second memory activation signal ce2 becomes "H", the second data input/output circuit 21 and the second address latch circuit 22 of the RAM 102 shown in FIG. 1 are activated, and the first data input/output circuit 11 and the first address latch circuit 12 of the flash memory 101 are deactivated. Furthermore, the signal {NWE} is made to "L" and an address to be written (address 3) is supplied to the external address terminals AD_C1 to AD_Cn and the external address terminals AD_R1 to AD_Rm as the signal {AD_C} and the signal {AD_R}. At this time, the second memory writing control signal we2 becomes "H", the data input circuits 21-21, 21-41 are activated, the target memory cells are selected, and data supplied to the external input/output terminals IO_C1 to IO_Ci and the external input/output terminals IO_R1 to IO_Ri as the signal {IO_C} and the signal {IO_R} are written to the first memory circuit 10 through the data input circuits 21-21, 21-41 as written data (between step S24 and S25 (not shown) in FIG. 12).

(Operation 7)

In a period from time t7 to t8, the signal {NCE_R} is made to "L", the signal {NCE_F} is made to "H", the RAM 102 is activated and the flash memory 101 is deactivated. By setting the signal {NOE} to "L", the second memory output control signal oe2 becomes "H", the data output circuits 21-11, 21-31 of the second data input/output circuit 21 shown in FIG. 8 are activated and data are read from memory cells at the address 3 as read data. The read data are outputted to the external input/output terminals IO_C1 to IO_Ci and the external input/output terminals IO_R1 to IO_Rj through the data output circuits 21-11, 21-31 as the signal {IO_C} and the signal {O_R}. It is determined whether or not the read data correspond to the written data by the tester (between step S24 and S25 (not shown) in FIG. 12).

Figure 10:
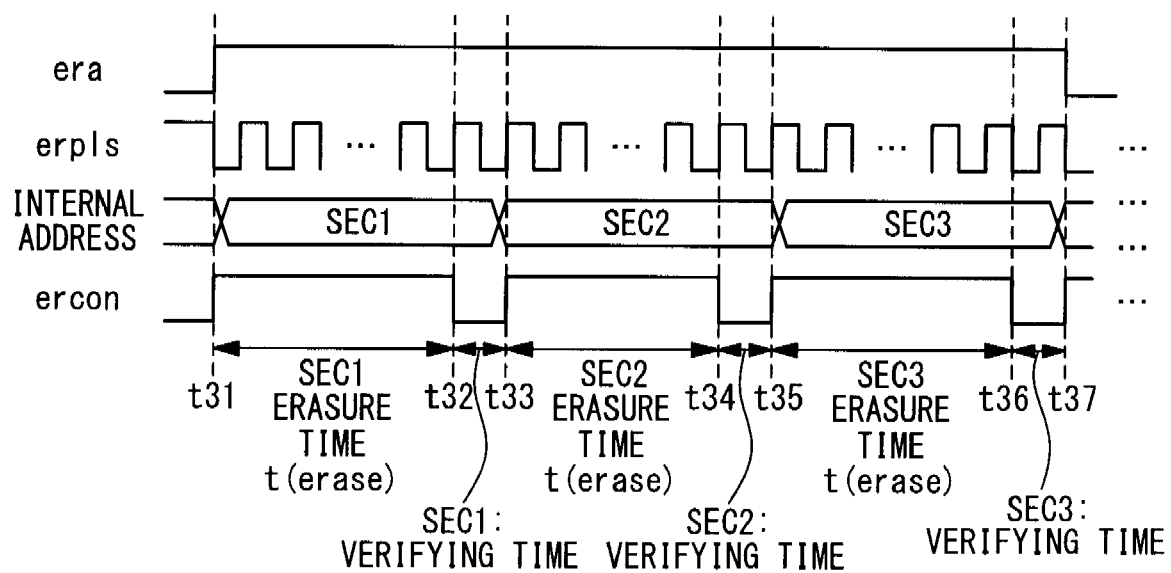
FIG. 10 is a timing chart for describing a "plural sectors erasure test" as a part of operations of the semiconductor device 100 according to the first embodiment of the present invention.

At this time, when the SEC 1 is erased in the sector erasure time t(erase) set in the erasure time setting register 14, as shown in FIG. 10, the erasure control signal ercon becomes "L", erasure is finished, verify of checking that each memory cell of SEC 1 is erased is performed in the erasure time setting register 14 (step S5 in FIG. 12). At this time, when an unerased cell exists, it is determined as "Fail", that is, a defective unit (N.G. at step S5 in FIG. 12). When it is confirmed that all memory cells are erased, the sector (SEC 2) to be erased next is selected according to the first internal address signals Ad11 to Ad1*n* and erasure is performed in the period t(erase) as in the SEC 1 (O.K. at step 5, and step S6 in FIG. 12).

(Operation 8)

In an erasure period of the SEC 2 of the flash memory 101 (step S7 in FIG. 12), in a period from time t8 to t9, the signal {NCE_R} is made to "L", the signal {NCE_F} is made to "H", RAM 102 is activated, flash memory 101 is deactivated. At this time, the second memory activation signal ce2 becomes "H", the second data input/output circuit 21 and the second address latch circuit 22 of the RAM 102 shown in FIG. 1 are activated and the first data input/output circuit 11 and the first address latch circuit 12 of the flash memory 101 are deactivated. Furthermore, a signal (NWE) is made to "L", and an address to be written (address 4) is supplied to the external address terminals AD_C1 to IO_Cn and the external address terminals AD_R1 to AD_Rm as the signal {AD_C} and the signal {AD_R}. At this time, the second memory writing control signal we2 becomes "H", the data input circuits 21-21, 21-41 are activated, the target memory cell are selected, and data supplied to the external input/output terminals IO_C1 to IO_Ci and the external input/output terminals IO_R1 to IO_Rj as the signal {IO_C} and the signal (IO_R} are written to the first memory circuit 10 through the data input circuits 21-21, 21-41 as written data (between step S24 and S25 (not shown) in FIG. 12).

(Operation 9)

In a period from time t9 to t10, the signal {NCE_R} is made to "L", the signal {NCE_F} is made to "H", the RAM 102 is activated and the flash memory 101 is deactivated. By setting the signal {NOE} to "L", the second memory output control signal oe2 becomes "H", the data output circuits 21-11, 21-31 of the second data input/output circuit 21 shown in FIG. 8 are activated and data are read from memory cells at the address 3 as read data. The read data are outputted to the external input/output terminals IO_C1 to IO_Ci and the external input/output terminals IO_R1 to IO_Rj through the data output circuits 21-11, 21-31 as the signal {IO_C} and the signal {IO_R}. It is determined whether or not the read data correspond to the written data by the tester (between step S24 and S25 (not shown) in FIG. 12).

(Operation 10)

Subsequently, in the erasure period of the SEC 2 of the flash memory 101 (step S7 in FIG. 12), in a period from time t10 to t11, the signal {NCE_R} is made to "L", the signal {NCE_F} is made to "H", the RAM 102 is activated and the flash memory 101 is deactivated. At this time, second memory activation signal ce2 becomes "H", the second data input/output circuit 21 and the second address latch circuit 22 of the RAM 102 shown in FIG. 1 are activated, the first data input/output circuit 11 and the first address latch circuit 12 of the flash memory 101 are deactivated. Furthermore, the signal {NWE} is made to "L" and an address to be written (address 5) is supplied to the external address terminals AD_C1 to AD_Cn and the external address terminals AD_R1 to AD_Rm as the signal {AD_C} and the signal {AD_R}. At this time, the second memory writing control signal we2 becomes "H", the data input circuits 21-21, 21-41 are activated, target memory cells are selected, and data supplied to the external input/output terminals IO_C1 to IO_Ci and the external input/output terminals IO_R1 to IO_Rj as the signal {IO_C} and the signal {IO_R} are written to the first memory circuit 10 through the data input circuits 21-21, 21-41 as written data (between step S24 and S25 (not shown) in FIG. 12).

(Operation 11)

In a period from time t11 to t12, the signal {NCE_R} is made to "L", the signal {NCE_F} is made to "H", the RAM 102 is activated and the flash memory 101 is deactivated. By setting the signal {NOE} to "L", the second memory output control signal oe2 becomes "H", the data output circuits 21-11, 21-31 of the second data input/output circuit 21 shown in FIG. 8 are activated and data are read from memory cells of the address 3 as read data. The read data are outputted to the external input/output terminals IO_C1 to IO_Ci and the external input/output terminals IO_R1 to IO_Rj through the data output circuit 21-11, 21-31 as the signal {IO_C} and the signal {IO_R}. It is determined whether or not the read data correspond to the written data by the tester (between step S24 and S25 (not shown) in FIG. 12).

(Operation 12)

Subsequently, in the erasure period of the SEC 2 of the flash memory 101 (step S7 in FIG. 12), in a period from time t12 to t13, the signal {NCE_R} is made to "L", the signal {NCE_F} is made to "H", the RAM 102 is activated and the flash memory 101 is deactivated. At this time, the second memory activation signal ce2 becomes "H", the second data input/output circuit 21 and the second address latch circuit 22 of the RAM 10s shown in FIG. 1 are activated and the first data input/output circuit 11 and the first address latch circuit 12 of the flash memory 101 are deactivated. Furthermore, the signal {NWE} is made to "L" and an address to be written (address 6) is supplied to the external input/output terminals IO_C1 to IO_Ci and the external input/output terminals IO_R1 to IO_Rj as the signal {AD_C} and the signal {AD_R}. At this time, the second memory writing control signal we2 becomes "H", the data input circuits 21-21, 21-41 are activated, the target memory cells are selected, and data supplied to the external input/output terminals IO_C1 to IO_Ci and the external input/output terminals IO_R1 to IO_Rj as the signal {IO_C} and the signal {IO_R} are written to the first memory circuit 10 through the data input circuits 21-21, 21-41 as written data (between step S24 and S25 (not shown) in FIG. 12).

(Operation 13)

In a period from time t13 to t14, the signal {NCE_R} is made to "L", the signal {NCE_F} is made to "H", the RAM 102 is activated and the flash memory 101 is deactivated. By setting the signal {NOE} to "L", the second memory output control signal oe2 becomes "H", the data output circuits 21-11, 21-31 of the second data input/output circuit 21 shown in FIG. 8 are activated and data are read from memory cells of the address 6 as read data. The read data are outputted to the external input/output terminals IO_C1 to IO_Ci and the external input/output terminals IO_R1 to IO_Rj through the data output circuits 21-11, 21-31 as the signal {IO_Cl and the signal {IO_R}. It is determined whether or not the read data correspond to the written data by the tester (between step S24 and S25 (not shown) in FIG. 12).

At this time, when the SEC 2 is erased in the sector erasure time t(erase) set in the erasure time setting register 14, as shown in FIG. 10, the erasure control signal ercon becomes "L", erasure is finished, verify of checking that each memory cell of SEC 2 is erased is performed in the erasure time setting register 14 (step S8 in FIG. 12). At this time, when an unerased cell exists, it is determined as "Fail", that is, a defective unit (N.G. at step S8 in FIG. 12). When it is confirmed that all memory cells are erased, the sector (SEC 3) to be erased next is selected according to the first internal address signals Ad11 to Ad1n and erasure is performed in the period t(erase) as in the SEC 1 and the SEC 2 (O.K. at step S8, step S9 in FIG. 12).

(Operation 14)

In an erasure period of the SEC 3 of the flash memory 101 (step S10 in FIG. 12), in a period from time t14 to t15, the signal {NCE_R} is made to "L", the signal {NCE_F} is made to "H", the RAM 102 is activated and the flash memory 101 is deactivated. At this time, the second memory activation signal ce2 becomes "H", the second data input/output circuit 21 and the second address latch circuit 22 of the RAM 102 as shown in FIG. 1 are activated and the first data input/output circuit 11 and the first address latch circuit 12 of the flash memory 101 are deactivated. Furthermore, signal {NWE} is made to "L", and an address to be written (address 7) is supplied to the external address terminals AD_C1 to AD_Cn and the external address terminals AD_R1 to AD_Rm as the signal {AD_C} and the signal {AD_R}. At this time, the second memory writing control signal we2 becomes "H", the data input circuits 21-21, 21-41 are activated, the target memory cells are selected, and data supplied to the external input/output terminals IO_C1 to IO_Ci and the external input/output terminals IO_R1 to IO_Rj as the signal {IO_C} and the signal {IO_R} are written to the first memory circuit 10 through the data input circuits 21-21, 21-41 as written data (between step S24 and S25 (not shown) in FIG. 12).

(Operation 15)

In a period from time t15 to t16, the signal {NCE_R} is made to "L", the signal {NCE_F} is made to "H", the RAM 102 is activated and the flash memory 101 is deactivated. By setting the signal {NOE} to "L", the second memory output control signal oe2 becomes "H", the data output circuits 21-11, 21-31 of the second data input/output circuit 21 shown in FIG. 8 are activated, data are read from memory cells of the address 7 as read data. The read data are outputted to the external input/output terminals IO_C1 to IO_Ci and the external input/output terminals IO_R1 to IO_Rj through the data output circuit 21-11, 21-31 as the signal {IO_C} and the signal {IO_R}. It is determined whether or not the read data correspond to the written data by the tester (between step S24 and S25 (not shown) in FIG. 12).

(Operation 16)

Subsequently, in the erasure period of the SEC 3 of the flash memory 101 (step S10 in FIG. 12), in a period from time t16 to t17, the signal {NCE_R} is made to "L", the signal {NCE_F} is made to "H", the RAM 102 is activated and the flash memory 101 is deactivated. At this time, second memory activation signal ce2 becomes "H", the second data input/output circuit 21 and the second address latch circuits 22 of the RAM 102 shown in FIG. 1 are activated, the first data input/output circuit 11 and the first address latch circuit 12 of the flash memory 101 are deactivated. Furthermore, the signal {NWE} is made to "L", and an address to be written (address 8) is supplied to the external address terminals AD_C1 to AD_Cn and the external address terminals AD_R1 to AD_Rm as the signal {AD_C} and the signal {AD_R}. At this time, the second memory writing control signal we2 becomes "H", the data input circuits 21-21, 21-41 are activated, the target memory cells are selected, and data supplied to the external input/output terminals IO_C1 to IO_Ci and the external input/output terminals IO_R1 to IO_Rj as the signal {IO_C} and the signal {IO_R} are written to the first memory circuit 10 through the data input circuits 21-21, 21-41 as written data (steps S24 between S25 (not shown) in FIG. 12).

(Operation 17)

In a period from time t17 to t18, the signal {NCE_R} is made to "L", the signal {NCE_F} is made to "H", the RAMI02 is activated and the flash memory 101 is deactivated. By setting the signal {NOE} to "L", the second memory output control signal oe2 becomes "H", the data output circuits 21-11, 21-31 of the second data input/output circuit 21 shown in FIG. 8 are activated and data are read from memory cells of the address 8 as read data. The read data are output to the external input/output terminals IO_C1 to IO_Ci and the external input/output terminals IO_R1 to IO_Rj through the data output circuits 21-11, 21, 31 as the signal {IO_C} and the signal {IO_R}. It is determined whether or not the read data correspond to the written data by the tester (steps S24, S25 in FIG. 12).

At this time, when the SEC 3 is erased in the sector erasure time t(erase) set in the erasure time setting register 14, as shown in FIG. 10, the erasure control signal ercon becomes "L", erasure mode is finished, verify of checking that each memory cell of SEC 3 is erased is performed in the erasure time setting register 14 (step S11 in FIG. 12). At this time, when an unerased cell exists, it is determined as "Fail", that is, a defective unit as shown in FIG. 12 (N.G. at step S11 in FIG. 12). When it is confirmed that all memory cells are erased, the first control circuit 13 searches as a sector to be erased next. However, since the SEC 3 is the last sector in the present embodiment, the erasure mode is finished, as shown in FIG. 10, the erasure mode signal era becomes "L" and the erasure pulse signal erpls is stopped (O.K. at the step S11 in FIG. 12).

(Operation 18)

Next, in a period from time t18 to t19, the signal {NCE_F} is set to "L", the signal {NCE_R} is set to "H", the flash memory 101 is activated and the RAM 102 is deactivated. At this time, the first memory activation signal ce1 becomes "H", the first data input/output circuit 11 and the first address latch circuit 12 of the flash memory 101 shown in FIG. 1 are activated, the second memory activation signal ce2 becomes "L", the second data input/output circuit 21 and the second address latch circuit 22 of the RAM 102 are deactivated. By setting the signal {NOE} to "L", the first memory output control signal oe1 becomes "H", the data output circuit 11-11 of the first data input/output circuit 11 shown in FIG. 3 is activated, memory cells of the SEC 1, the SEC 2 and the SEC 3 as sectors to be erased are sequentially read. The reading results are outputted to the external input/output terminals IO_C1 to IO_Ci through the first data input/output circuit 11 as the signal {IO_C}, and it is determined whether or not data in each memory cell is erased by the tester (step S12 in FIG. 12).

As described above, the semiconductor device 100 according to the first embodiment of the present invention includes the "erasure time setting register 14" for setting the assurance value of erasure time (sector erasure assurance time) of the flash memory 101. Therefore, an internal erasure operation can be controlled on the basis of the data of the erasure time setting register 14. Accordingly, also in the "plural sectors erasure test" of sequentially erasing data stored in the selected sectors among a plurality of sectors, the test of the RAM 102 can be conducted simultaneously while the erasure time setting register 14 determines whether or not the data stored in each sector is erased within the sector erasure assurance time. Thus, a test which requires long time such as the "data holding test" of the RAM 102 and the erasure test of the flash memory 101 can be conducted at the same time. Here, the data holding test is the test that data is written in the RAM memory cell and then, the data is read after standby state for a certain time to confirm the data. For example, since the erasure time for one sector is generally a few hundred of msec, it is assumed that the sector erasure assurance time of one sector is set to 500 msec in the erasure time setting register 14, when "eight-sector-erasure" is executed, 4 seconds can be reserved. Thus, it becomes possible to simultaneously conduct the test which requires long time such as the data holding test of the RAM 102.

Figure 13:
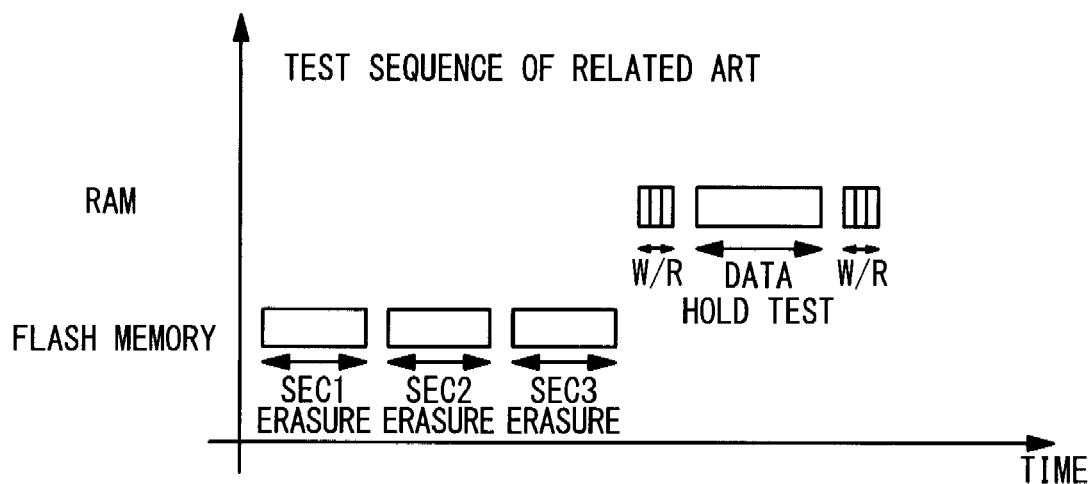
FIG. 13 is a view showing a test sequence in a semiconductor device according to a related art.
Figure 14:
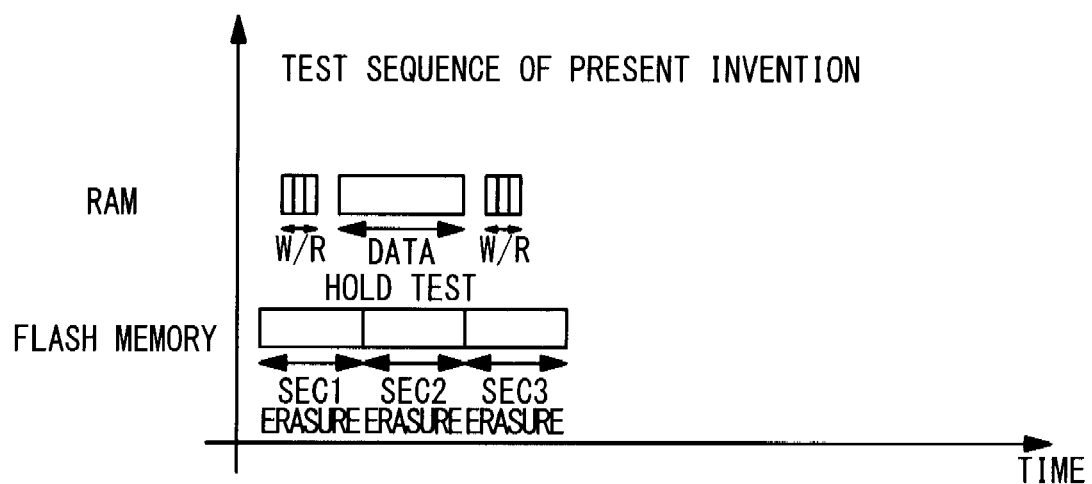
FIG. 14 is a view showing a test sequence in a semiconductor device according to the present invention.

Furthermore, in the semiconductor device 100 according to the first embodiment of the present invention, even when the external address terminals and the external input/output terminals of the RAM 102 have different configuration from those of the flash memory 101, as shown in FIG. 11, by separately controlling the external address terminals AD_C1 to AD_Cn (AD_C) common to the flash memory 101 and the RAM 102 and the external address terminals AD_R1 to AD_Rm (AD_R) dedicated to the RAM 102, and separately controlling the external input/output terminals IO_C1 to IO_Ci (IO_C) common to the flash memory 101 and the RAM 102 and the external input/output terminals IO_R1 to IO_Rj (IO_R) dedicated to the RAM 102, memories having different memory capacities or data bus widths can be simultaneously tested. As a result, for example, when the flash memory 101 of 64 Mbits (2 M words×16 bits configuration) and the RAM 102 of 256 Mbits (8 M words×32 bits configuration) are tested, according to the related art, as shown in FIG. 13, the flash memory 101 and the RAM 102 are serially tested. On the contrary, according to the present invention, as shown in FIG. 14, the flash memory 101 and the RAM 102 can be simultaneously tested, thereby reducing test time.

Second Embodiment

[Configuration]

Figure 15:
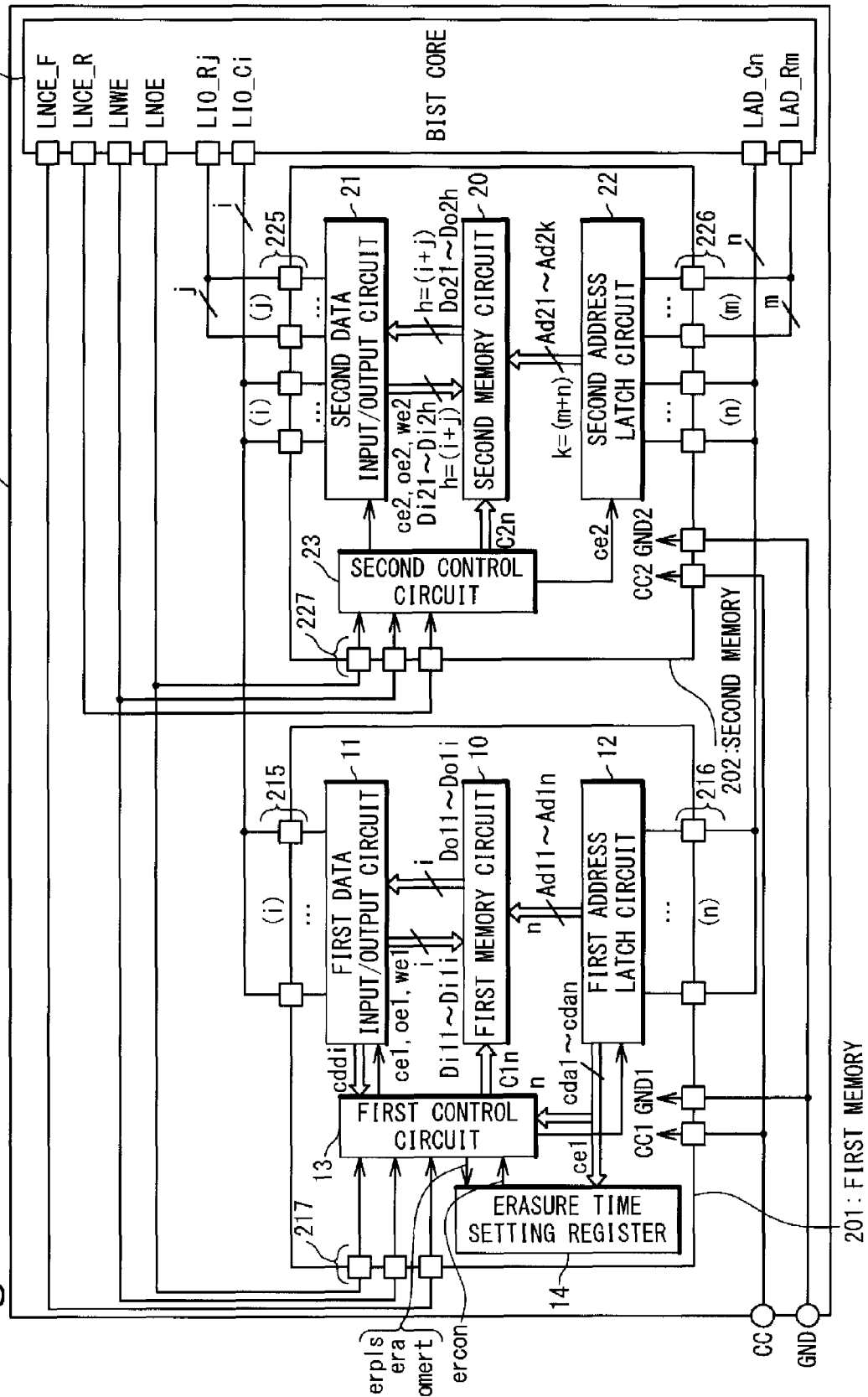
FIG. 15 is a block diagram showing a configuration of a semiconductor device 200 (system LSI) according to a second embodiment of the present invention.

FIG. 15 is a block diagram showing a configuration of a semiconductor device 200 (system LSI) according to a second embodiment of the present invention. In the second embodiment, overlapping description with the first embodiment is omitted and the same reference letters are given to the same elements as those in the first embodiment. The semiconductor device 200 in the second embodiment includes a first memory core 201 and a second memory core 202 as a plurality of memory cores formed on the same semiconductor substrate and a BIST (Built-In-Self-Test) core 203 for conducting a test of the plurality of memory cores. The first memory core 201 is different from the second memory core 202 in a data storage system of internal memory cells. For example, it is assumed that the first memory core 201 is a flash memory core and the second memory core 202 is a RAM (DRAM or SRAM) core. The BIST core 203 controls the flash memory core 201 and the RAM core 202 in a test of the semiconductor device 200 prior to shipment and checks functions of the flash memory core 201 and the RAM core 202.

The BIST core 203 includes internal address input terminals LAD_CI to LAD_Cn (Cn is an integer equal to or greater than 1), LAD_R1 to LAD_Rm (m is an integer equal to or greater than 1), internal input/output terminals LIO_C1 to LIO_Ci (i is an integer equal to or greater than 1), LIO_R1 to LiO_Rj (j is an integer equal to or greater than 1) as internal terminals. That is, the BIST core 203 includes the internal terminals (internal address input terminals LAD_C1 to LAD_Cn, LAD_R1 to LAD_Rm, internal input/output terminals LIO_C1 to IO_Ci, LIO_R1 to LiO_Rj) in place of the external terminals (external address terminals AD_C1 to AD_Cn, AD_R1 to AD_Rm, external input/output terminals IO_C1 to IO_C1, IO_R1 to IO_Rj) in the first embodiment. The internal address terminals LAD_C1 to LAD_Cn are commonly used by the flash memory core 201 and the RAM core 202. The internal address terminals LAD_R1 to LAD_Rm are used by only the RAM core 202. The internal input/output terminals LIO_C1 to LIO_Ci are commonly used by the flash memory core 201 and the RAM core 202. The internal input/output terminals LIO_R1 to LIO_Rj are used by only the RAM core 202. Actually, although the internal address terminals LAD_C1 to LAD_Cn are n number of terminals and the internal address terminals LAD_R1 to LAD_Rm are m number of terminals, they are partially omitted in the figure for simplification. Although the internal input/output terminals LIO_C1 to LIO_Ci are i number of terminals and the internal input/output terminals LIO_R1 to LIO_Rj are j number of terminals, they are partially omitted in the figure for simplification.

The BIST core 203 further includes internal control terminals LNOE, LNWE, LNCE_F, LNCE_R as internal terminals. That is, the BIST core 203 includes the above-mentioned internal terminals (internal control terminal LNOE, LNWE, LNCE_F, LNCE_R) in place of the external terminals (external control terminals NOE, NWE, NCE_F, NCE_R) in the first embodiment. The internal control terminal LNOE is a terminal for controlling outputs of the flash memory core 201 and the RAM core 202. The internal control terminal LNWE is a terminal for controlling writing to the flash memory core 201 and the RAM core 202. The internal control terminal LNCE_F is a terminal for controlling activation/deactivation of the flash memory core 201. The internal control terminal LNCE_R is a terminal for controlling activation/deactivation of the RAM core 202.

The flash memory core 201 includes the first memory circuit 10, the first data input/output circuit 11, the first address latch circuit 12, the first control circuit 13, a first data input/output internal terminal group 215, a first address input internal terminal group 216, a first control internal terminal group 217 and the erasure time setting register 14. That is, the flash memory core 201 includes the first data input/output internal terminal group 215, the first address input internal terminal group 216 and the first control internal terminal group 217 in place of the first data input/output terminal group 15, the first address input terminal group 16 and the first control terminal group 17 in the first embodiment. The first data input/output internal terminal group 215 is connected to i number of internal data input/output lines connected to the internal input/output terminals LIO_C1 to LIO_Ci, respectively. The first data input/output circuit 11 is connected to the first data input/output internal terminal group 215. The first address input internal terminal group 216 is connected to n number of internal address input lines connected to the internal address input terminals LAD_C1 to LAD_Cn, respectively. The first address latch circuit 12 is connected to the first address input internal terminal group 216. The first control internal terminal group 217 is connected to an internal control line group connected to the internal control terminal LNOE, LNWE and the LNCE_F. The first control circuit 13 is connected to the first control internal terminal group 217, the first data input/output circuit 11 and the first address latch circuit 12 and control the writing/erasure/reading operations of the first memory circuit 10. The erasure time setting register 14 receives outputs of the first control circuit 13 and the first address latch circuit 12 and sets erasure time of "sector" as an erasure unit of the memory cells in the first memory circuit 10.

The RAM core 202 includes the second memory circuit 20, the second data input/output circuit 21, the second address latch circuit 22, the second control circuit 23, a second data input/output internal terminal group 225, a second address input internal terminal group 226 and a second control internal terminal group 227. That is, the RAM core 202 includes the second data input/output internal terminal group 225, the second address input internal terminal group 226 and the second control internal terminal group 227 in place of the second data input/output terminal group 25, the second address input terminal group 26 and the second control terminal group 27 in the first embodiment. The second data input/output internal terminal group 225 is connected to i number of internal data input/output lines connected to the internal input/output terminals LIO_C1 to LIO_Ci and j number of internal data input/output lines connected to the internal input/output terminals LIO_R1 to LIO_Ri. The second data input/output circuit 21 is connected to the second data input/output internal terminal group 225. The second address input internal terminal group 226 is connected to n number of internal address input lines connected to the internal address input terminals LAD_C1 to LAD_Cn and m number of internal address input lines connected to the internal address terminals LAD_R1 to LAD_Rm. The second address latch circuit 22 is connected to the second address input internal terminal group 226. The second control terminal group 27 is connected to the internal control line group connected to the internal control terminals LNOE, LNWE and the LNCE_R. The second control circuit 23 is connected to the second control internal terminal group 227, the second data input/output circuit 21 and the second address latch circuit 22 and the writing/erasure/reading operations of the second memory circuit 20.

[Operations]

Operations of the semiconductor device 200 according to the second embodiment of the present invention will be described. In the present embodiment, a case where a data holding test (or hold test) of the RAM core 202 is conducted in a "plural sectors erasure test" period of the flash memory core 201 will be described. Here, the plural sectors erasure test period is the period during which data stored in selected sectors (part or all of sectors) selected from a plurality of sectors in the flash memory core 201 are erased. In the plural sectors erasure test, a case where data in a sector 1 (SEC 1), a sector 2 (SEC 2) and a sector 3 (SEC 3) as the selected sectors are serially erased in this order will be described. In the data holding test, a writing/reading test (hereinafter referred to as a W/R test) of the RAM core 102 will be described.

Figure 16:
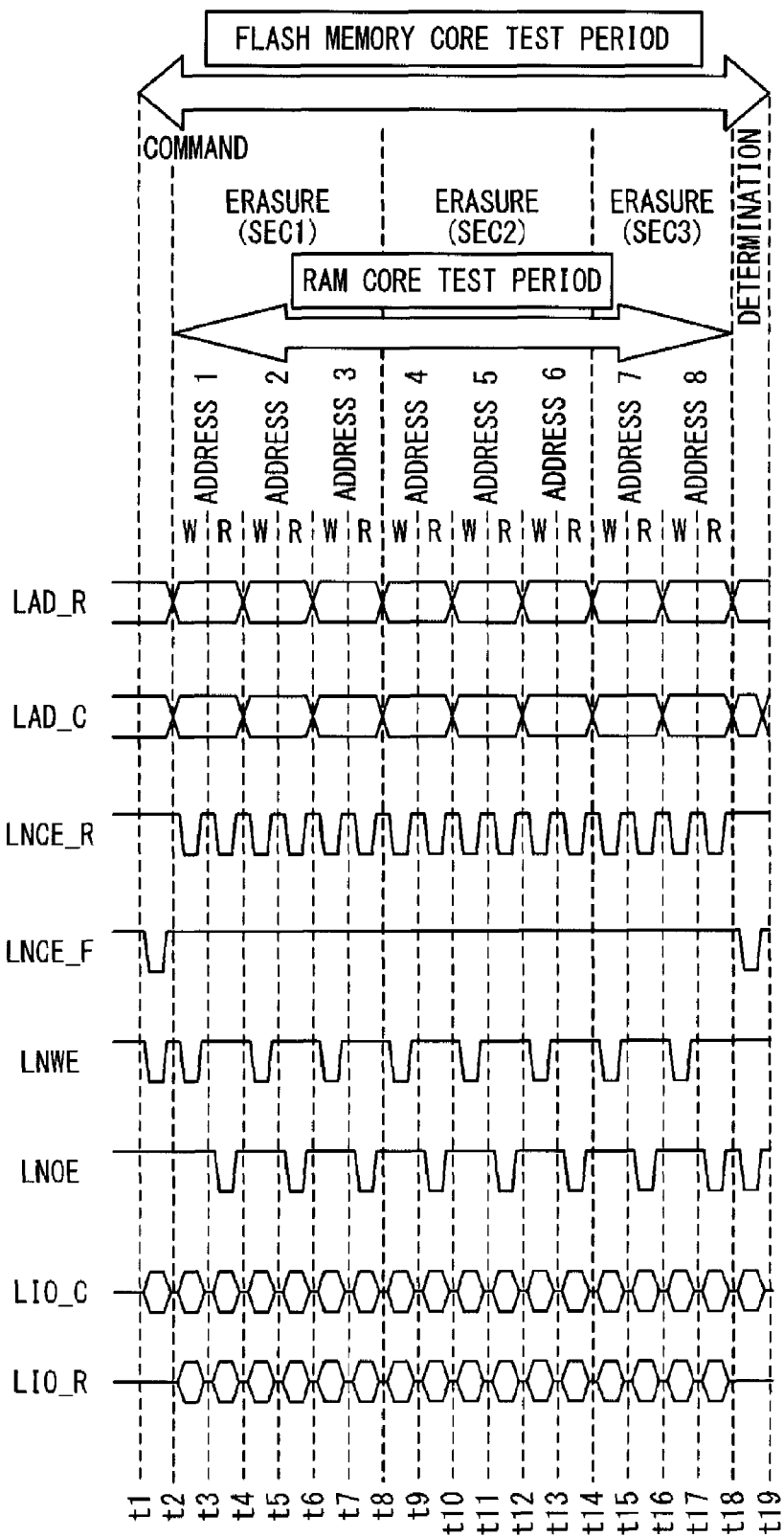
FIG. 16 is a timing chart showing signals supplied to each internal terminal of the semiconductor device 200 when the plural sectors erasure test and the W/R test are simultaneously conducted.

FIG. 16 is a timing chart showing signals supplied to the internal terminals of the semiconductor device 200 when the plural sectors erasure test and the W/R test are simultaneously conducted. A signal {LAD_R} represents a signal supplied to each of the internal address terminals LAD_R1 to LAD_Rm. A signal {LAD_C} represents a signal supplied to each of the internal address terminals LAD_C1 to LAD_Cm. A signal {LNCE_R} represents a signal supplied to the internal control terminal LNCE_R. A signal {LNCE_F} represents a signal supplied to the internal control terminal LNCE_F. A signal {LNWE} represents a signal supplied to the internal control terminal LNWE. A signal {LNOE} represents a signal supplied to the internal control terminal LNOE. A signal {LIO_C} represents a signal supplied to each of the internal input/output terminal LIO_C1 to LIO_Ci. A signal {LIO_R} represents a signal supplied to each of the internal input/output terminals LIO_R1 to LIO_Rj.

In the first embodiment, in the test, the tester compares data supplied to the external input/output terminals IO_C1 to IO_Ci and IO_R1 to IO_Rj of the semiconductor device 100 with an expected value (written data) to determine non-defective unit/defective unit of the flash memory 101 and the RAM 102 (steps S5, S8, S11, S22, S24, S26 in FIG. 12). On the contrary, in the second embodiment, the BIST core 203 compares data supplied to the internal input/output terminal LIO_C1 to LIO_Ci and LIO_R1 to LIO_Rj with an expected value (written data) to determine non-defective unit/defective unit of the flash memory core 201 and the RAM core 202. Since other operations in the second embodiment are the same as those in first embodiment, detailed description is omitted.

As described above, since the semiconductor device 200 according to the second embodiment of the present invention includes the "erasure time setting register 14" for setting the assurance value of erasure time of the flash memory core 201 (sector erasure assurance time), internal erasure operations can be controlled on the basis of data of the erasure time setting register 14. Accordingly, also in the "plural sectors erasure test" of sequentially erasing data stored in the selected sectors among a plurality of sectors, the test of the RAM core 202 can be conducted simultaneously while the erasure time setting register 14 determines whether or not the data stored in each sector is erased within the sector erasure assurance time. Thus, a test which requires long time such as the "data holding test" of writing data in the RAM memory cell and then, reading the data after standby state for a certain time to confirm the data and the erasure test of the flash memory core 201 can be conducted at the same time. For example, since the erasure time for one sector is generally a few hundred of msec, it is assumed that the sector erasure assurance time of one sector is set to 500 msec in the erasure time setting register 14, when "eight-sector-erasure" is executed, four seconds can be reserved. Thus, it becomes possible to simultaneously conduct the test which requires long time such as the data holding test of the RAM core 202.

Furthermore, in the semiconductor device 200 according to the second embodiment of the present invention, even when the internal address terminals and the internal input/output terminals of the RAM 202 have different configuration from those of the flash memory 101, as shown in FIG. 16, by separately controlling the internal address input terminals LAD_C1 to LAD_Cn (LAD_C) common to the flash memory core 201 and the RAM core 202 and the internal address terminals LAD_R1 to LAD_Rm (LAD_R) dedicated to the RAM core 202, and separately controlling the internal data input/output terminals LIO_C1 to LIO_Ci (LIO_C) common to the flash memory core 201 and the RAM core 202 and the internal data input/output terminals LIO_R1 to LIO_Rj (IO_R) dedicated to the RAM core 202, memory cores having different memory capacities or data bus widths can be simultaneously tested. As a result, for example, when the flash memory core 201 of 64 Mbits (2 M words×16 bits configuration) and the RAM core 202 of 256 Mbits (8 M words×32 bits configuration) are tested, according to the related art, as shown in FIG. 13, the flash memory core 201 and the RAM core 202 are serially tested. On the contrary, according to the present invention, as shown in FIG. 14, the flash memory core 201 and the RAM core 202 can be simultaneously tested, thereby reducing test time.

[First Extension]

Figure 17A:
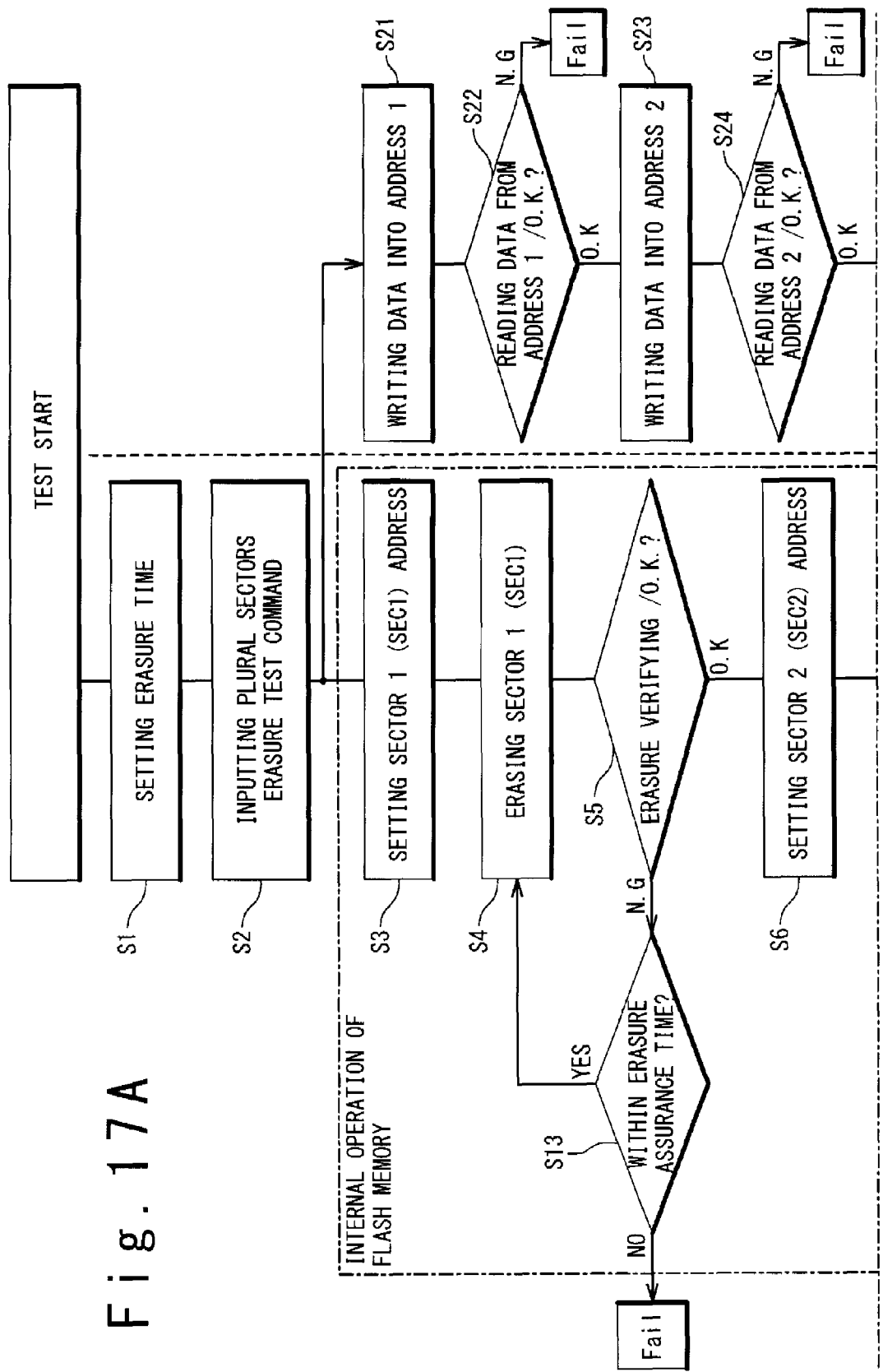
FIG. 17A is a flow chart in a case an erasure control method of repeating erasure and verify in FIG. 12 is used.
Figure 17B:
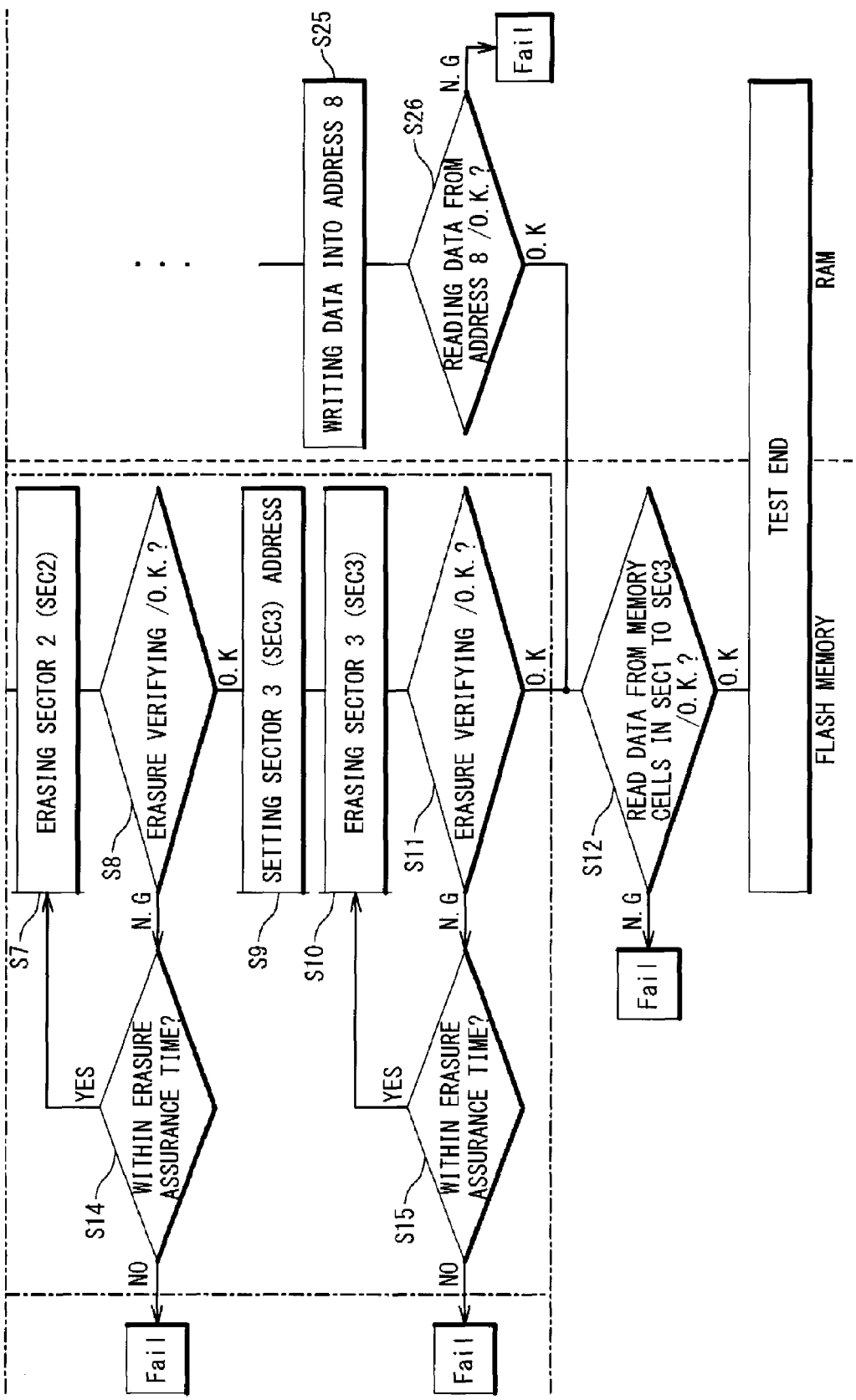
FIG. 17B is a flow chart in the case the erasure control method of repeating erasure and verify in FIG. 12 is used.

In the above-mentioned embodiments, the examples of the erasure control method are described in which erasure is performed in the erasure period t(erase) and then, verify is performed. However, the present invention can be applied to the case of the erasure control method in which erasure periods t(erase) is segmented for repeating erasure and verify. Figs. 17A and 17B are flow charts showing a case where this erasure method is adopted. When verify is performed in the erasure time setting register 14 at steps S5, S8, S11 and an unerased cell exists (N.G. at step S5, N.G. at step S8, N.G. at step S11), if the time is within the sector erasure assurance time (YES at step S13, YES at step S14, YES at step S15), the above-mentioned steps S4, S7, S10 are executed. On the other hand, if the time is not within the sector erasure assurance time, the unit is determined as "Fail", that is, a defective unit (NO at step S13, NO at step S14, NO at step S15).

[Second Extension]

In the above-mentioned embodiments, two memories are mounted. However, the present invention can be applied to a case where three or more memories are mounted or a semiconductor device other than the memory, for example, a logic LSI and microcomputer, is mounted.

As described above, since a test time can be made shorter than the related art according to the present invention, test cost is reduced and thus the semiconductor devices 100, 200 can be provided at lower cost. The present invention is effective to especially, a semiconductor device having many kinds of memories or memories with a large capacity.

It is apparent that the present invention is not limited to the above embodiment, but may be modified and changed without departing from the scope and spirit of the invention.

What is claimed is:

1. A semiconductor device comprising:
a first memory; and
a second memory,
wherein said first memory includes:
a first memory cell array configured to be divided into a plurality of sectors,
an erasure time setting register configured to hold a sector erasure assurance time to assure an erasure time for erasing data stored in one sector, and
a first control circuit configured to execute a sector erasure test in which data stored in at least one selected sector selected from said plurality of sectors are erased within said sector erasure assurance time,
wherein said second memory includes:
a second memory cell array configured to have a data storage system different from that of said first memory cell array, and
a second control circuit configured to execute a data hold test with respect to said second memory cell array while said sector erasure test is executed.

2. The semiconductor device according to claim 1, wherein, in a case that the time when data stored in a sector of said at least one selected sector are erased is within said sector erasure assurance time, said first control circuit erases data stored in next sector of said at least one selected sector.

3. The semiconductor device according to claim 1, wherein said second control circuit writes a write data into a target memory cell of said second memory cell array and read out said written data from said target memory cell as a read data in said data hold test.

4. The semiconductor device according to claim 1, wherein said first memory includes a flash memory, and
said second memory includes a RAM.

5. The semiconductor device according to claim 1, wherein said first memory and said second memory are mounted on a same package.

6. The semiconductor device according to claim 1, further comprising:
a BIST (Built-In-Self-Test) circuit configured to control said first control circuit so as to execute said sector erasure test and control said second control circuit so as to execute said data hold test.

7. The semiconductor device according to claim 6, wherein said first memory, said second memory and said BIST circuit are formed on a same semiconductor substrate.

8. A method of testing a semiconductor substrate, comprising:
providing a semiconductor device, wherein said semiconductor includes:
a first memory including a first memory cell array divided into a plurality of sectors, and an erasure time setting register, and
a second memory including a second memory cell array having a data storage system different from that of said first memory cell array;
setting a sector erasure assurance time to assure an erasure time for erasing data stored in one sector in said erasure time setting register;
executing a sector erasure test in which data stored in at least one selected sector selected from said plurality of sectors are erased within said sector erasure assurance time; and
executing a data hold test with respect to said second memory cell array while said sector erasure test is executed.

9. The method of testing a semiconductor substrate, according to claim 8, wherein said executing said sector erasure test step includes:
erasing data stored in next sector of said at least one selected sector in a case that the time when data stored in a sector of said at least one selected sector are erased is within said sector erasure assurance time.

10. The method of testing a semiconductor substrate, according to claim 8, wherein said executing said data hold test step includes:
writing a write data into a target memory cell of said second memory cell array and reading out said written data from said target memory cell as a read data.

11. A method of testing a semiconductor substrate, comprising:
providing a semiconductor device, wherein said semiconductor includes:
a first memory including a first memory cell array divided into a plurality of sectors, and an erasure time setting register,
a second memory including a second memory cell array having a data storage system different from that of said first memory cell array, and
a BIST (Built-In-Self-Test) circuit;
said BIST circuit setting a sector erasure assurance time to assure an erasure time for erasing data stored in one sector in said erasure time setting register;
said BIST circuit executing a sector erasure test in which data stored in at least one selected sector selected from said plurality of sectors are erased within said sector erasure assurance time; and
said BIST circuit executing a data hold test with respect to said second memory cell array while said sector erasure test is executed.

12. The method of testing a semiconductor substrate, according to claim 11, wherein said executing said sector erasure test step includes:
erasing data stored in next sector of said at least one selected sector in a case that the time when data stored in a sector of said at least one selected sector are erased is within said sector erasure assurance time.

13. The method of testing a semiconductor substrate, according to claim 11, wherein said executing said data hold test step includes:
writing a write data into a target memory cell of said second memory cell array and reading out said written data from said target memory cell as a read data.

* * * * *